United States Patent
Iwamoto et al.

(10) Patent No.: US 7,884,423 B2
(45) Date of Patent: Feb. 8, 2011

(54) SEMICONDUCTOR DEVICE AND FABRICATION METHOD THEREOF

(75) Inventors: Kunihiko Iwamoto, Kyoto (JP); Arito Ogawa, Toyama (JP); Yuuichi Kamimuta, Yokohama (JP)

(73) Assignees: Rohm Co., Ltd., Kyoto-fu (JP); Hitachi Kokusai Electric Inc., Tokyo (JP); Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 12/134,516

(22) Filed: Jun. 6, 2008

(65) Prior Publication Data

US 2008/0303099 A1 Dec. 11, 2008

(30) Foreign Application Priority Data

Jun. 8, 2007 (JP) .......................... P2007-152871

(51) Int. Cl.
H01L 21/70 (2006.01)
H01L 21/8238 (2006.01)

(52) U.S. Cl. ...................................... 257/369; 438/216

(58) Field of Classification Search ................. 438/216; 257/369
See application file for complete search history.

(56) References Cited

U.S. PATENT DOCUMENTS

| 6,177,303 | B1 | 1/2001 | Schmitz et al. | |
| 7,238,996 | B2 | 7/2007 | Kimizuka et al. | |
| 7,588,989 | B2 * | 9/2009 | Kim et al. | 438/287 |
| 2005/0098839 | A1 * | 5/2005 | Lee et al. | 257/410 |
| 2005/0263802 | A1 | 12/2005 | Kimikuza et al. | |

(Continued)

FOREIGN PATENT DOCUMENTS

CN 1296639 5/2001

(Continued)

OTHER PUBLICATIONS

Wang et al., "Wide $V_{fb}$ and $V_{th}$ Tunability for Metal-Gated MOS Devices with HfLaO Gate Dielectrics", IEEE Election Letters, 28(4):258-260 (2007).

(Continued)

Primary Examiner—N Drew Richards
Assistant Examiner—Grant S Withers
(74) Attorney, Agent, or Firm—Fish & Richardson P.C.

(57) ABSTRACT

CMISFETs having a symmetrical flat band voltage, the same gate electrode material, and a high permittivity dielectric layer is provided for a semiconductor device including n-MISFETs and p-MISFETs, and a fabrication method thereof, the n-MISFETs including: a first metal oxide layer 20, placed on the 1st gate insulating film 16, having a composition ratio shown with $M1_xM2_yO$ (where M1=Y, La, Ce, Pr, Nd, Sm, Gd, Tb, Dy, Ho, Er, Tm, Yb or Lu, M2=Hf, Zr or Ta, and $x/(x+y)>0.12$); a second metal oxide layer 24; and a second metal oxide layer 24, the p-MISFETs including: a second gate insulating film 18 placed on the surface of the semiconductor substrate 10; a third metal oxide layer 22, placed on the 2nd gate insulating film 18, having a composition ratio shown with M3zM4wO (M3=Al, M4=Hf, Zr or Ta, and $z/(z+w)>0.14$); a fourth metal oxide layer 26; and a second conductive layer 30 placed on the fourth metal oxide layer 26.

19 Claims, 14 Drawing Sheets

| | 1 | 2 | 3 | 4 |
|---|---|---|---|---|
| UPPER HIGH PERMITTIVITY LAYER (34) | $HfO_2$ | $Al_2O_3$ | $HfO_2$ | $Y_2O_3$ |
| LOWER HIGH PERMITTIVITY LAYER (32) | $Al_2O_3$ | $HfO_2$ | $Y_2O_3$ | $HfO_2$ |

ALD

U.S. PATENT DOCUMENTS

| | | | |
|---|---|---|---|
| 2007/0187772 A1* | 8/2007 | Ahn et al. | 257/369 |
| 2009/0114996 A1* | 5/2009 | Inumiya et al. | 257/369 |
| 2009/0212371 A1* | 8/2009 | Kobayashi | 257/369 |
| 2009/0218634 A1* | 9/2009 | Sakashita et al. | 257/369 |

FOREIGN PATENT DOCUMENTS

| | | |
|---|---|---|
| CN | 1702866 | 11/2002 |
| JP | 2006-80133 | 3/2006 |
| JP | 2006-278376 | 10/2006 |
| JP | 2007-80955 | 3/2007 |

OTHER PUBLICATIONS

Ashareef et al., "Thermally Stable N-Metal Gate MOSFETs Using La-Incorporated HfSiO Dielectric", Symp. on VLSI Tech. Digest of Tech. Papers pp. 10-11 (2006).

Jung et al., "Dual High-k Gate Dielectric Tech. Using AIO Etch (SAE) Process with Nitrogen and Fluorine Inc.", Symp. on VSLI Tech. Digest of Tech. Papers, pp. 204-205 (2006).

Lee et al., "Poly-Si/AlN/HfSiO stack for ideal threshold voltage and mobility in sub-100nm MOSFETs", Symp. on VSLI Tech. Digest of Tech. Papers, pp. 202-203 (2006).

* cited by examiner

|  | 1 | 2 | 3 | 4 |
|---|---|---|---|---|
| UPPER HIGH PERMITTIVITY LAYER (34) | $HfO_2$ | $Al_2O_3$ | $HfO_2$ | $Y_2O_3$ |
| LOWER HIGH PERMITTIVITY LAYER (32) | $Al_2O_3$ | $HfO_2$ | $Y_2O_3$ | $HfO_2$ |

ALD (a)          (b)

SEMICONDUCTOR DEVICE AND FABRICATION METHOD THEREOF

CROSS REFERENCE TO RELATED APPLICATIONS AND INCORPORATION BY REFERENCES

This application is based upon and claims the benefit of priority from prior Japanese Patent Application NO. P2007-152871 filed on Jun. 8, 2007, the entire contents of which are incorporated herein by reference.

BACKGROUND OF THE INVENTION

1. Field of the Invention

The present invention relates to a semiconductor device and a fabrication method thereof, in particular, to a semiconductor device and a fabrication method thereof including a MOS transistor.

2. Description of the Related Art

Up to now, the following measures have been achieved about control of a flat band voltage $V_{FB}$ or a threshold voltage $V_{th}$ of Complementary Metal Insulator Semiconductor Field Effect Transistors (CMISFETs) having a high permittivity (High-k) layer.

That is, a first method is a method of using an independent gate electrode material in n-channel MISFETs and p-channel MISFETs (e.g., refer to Patent Document 1 and Patent Document 2). The patent document 1 discloses an example, which applies NiSi as a gate electrode of n-MISFETs and $Ni_3Si$ as a gate electrode of p-MISFETs. Furthermore, the patent document 2 discloses an example, which applies NiSi as a gate electrode of n-MISFETs and Pt as a gate electrode of p-MISFETs. Fundamentally, selection of the gate electrode is achieved so that a work function of an n-MIS gate becomes lower than a work function of a p-MIS gate. However, Ni silicide material is sensitive to annealing temperature, and the composition ratio (stable phase) changes easily. Moreover, since Pt series material is reducing material, the Pt series material is sensitive to annealing temperature and atmosphere, and changes the character of an underlying insulating film. For this reason, the annealing condition after electrode formation is restrained.

A second method is a method of inserting an $La_2O_3$ layer to n-MIS and inserting an $Al_2O_3$ layer to p-MIS as a independent capping layer for a gate electrode/high permittivity (High-k) layer interface, in n-channel MISFETs and p-channel MISFETs (e.g., refer to Non-Patent Document 1, Non-Patent Document 2, and Non-Patent Document 3). The capping layer is inserted in order to ease or remove the FLP (Fermi Level Pinning) phenomenon in the gate electrode/high permittivity (High-k) layer interface. However, even when using the capping layer, in order to shift a flat band voltage $V_{FB}$, an interface with a high permittivity (High-k) layer/gate insulating film ($SiO_2$) is important, and the diffusion process to the interfacial region must be used.

A third method is a method to set up so that a threshold voltage $V_{th}$ of $n^+$ polysilicon gate and $p^+$ polysilicon gate may become symmetrical by controlling Al concentration in a high permittivity (High-k) gate insulating film, in n-MISFETs and p-MISFETs (e.g., refer to Patent Document 3). However, the concentration range where the symmetry of the threshold voltage $V_{th}$ is obtained by Al concentration is dramatically narrow, and it is anxious about degradation of the electrical characteristics by Al introduction to n-MISFETs.

[Patent Document 1] JP, 2007-80955, A (pp. 11-14, and FIG. 1)

[Patent Document 2] JP, 2006-80133, A (pp. 8-9, and FIG. 1)

[Patent Document 3] JP, 2006-278376, A (pp. 7-8, and FIG. 4)

[Non-Patent Document 1] H. N. Alshareef et al., "Thermally Stable N-Metal Gate MOSFETs Using La-Incorporated HfSiO Dielectric", 2006 Symposium on VLSI Technology Digest of Technical Papers, pp. 10-11.

[Non-Patent Document 2] Hyung-Suk Jung et al., "Dual High-k Gate Dielectric Technology Using $AlO_x$ Etch (SAE) Process with Nitrogen and Fluorine Incorporation", 2006 Symposium on VLSI Technology Digest of Technical Papers, pp. 204-205.

[Non-Patent Document 3] K. L. Lee et al., "Poly-Si/AlN/HfSiO stack for ideal threshold voltage and mobility in sub-100 nm MOSFETs", 2006 Symposium on VLSI Technology Digest of Technical Papers, pp. 202-203.

SUMMARY OF THE INVENTION

It is an object of the present invention to provide a semiconductor device of CMISFETs configuration and a fabrication method thereof, having same gate electrode material and same high permittivity (high-k) dielectric layer for n-/p-MISFETs, in a symmetrical flat band voltage $V_{FB}$ (or a threshold voltage $V_{th}$).

At this point, in order to solve the above-mentioned problem, the present inventor formed a HfYO film more than Y composition ratio 12 at. % on $SiO_2$ in the case of an n-MISFETs region, and formed $HfO_2$ on the formed HfYO film. In the case of a p-MISFETs region, a HfAlO film more than Al composition ratio 14 at. % was formed on $SiO_2$, and $HfO_2$ was formed on the formed HfYO film. Furthermore, n-/p-MISFETs were formed in a gate electrode material by using TaN, and a symmetrical flat band voltage $V_{FB}$ (or threshold voltage $V_{th}$) was realized.

According to an aspect of the present invention, a complementary semiconductor device comprising: an n-channel type first MISFET, and a p-channel type second MISFET, the n-channel type first MISFET comprising: a first gate insulating film placed on a semiconductor substrate surface; a first metal oxide layer placed on the first gate insulating film, and having a composition ratio shown with $M1_xM2_yO$ (where M1=Y, La, Ce, Pr, Nd, Sm, Gd, Th, Dy, Ho, Er, Tm, Yb or Lu, M2=Hf, Zr, or Ta, and $x/(x+y)>0.12$); a second metal oxide layer placed on the first metal oxide layer; and a first conductive layer placed on the second metal oxide layer, the p-channel type second MISFET comprises: a second gate insulating film placed on the semiconductor substrate surface; a third metal oxide layer placed on the second gate insulating film, and having a composition ratio shown with $M3_zM4_wO$ (where M3=Al, M4=Hf, Zr, or Ta, and $z/(z+w)>0.14$); a fourth metal oxide layer placed on the third metal oxide layer; and a second conductive layer placed on the fourth metal oxide layer, is provided.

According to another aspect of the present invention, a method for fabricating a complementary semiconductor device comprising: forming a gate insulating film on a semiconductor substrate; forming a first metal oxide layer having a composition ratio shown with $M1_xM2_yO$ (where M1=Y, La, Ce, Pr, Nd, Sm, Gd, Th, Dy, Ho, Er, Tm, Yb or Lu, M2=Hf, Zr or Ta, and $x/(x+y)>0.12$) on the gate insulating film by an ALD method or a CVD method; forming a third metal oxide layer having a composition ratio shown with $M3_zM4_wO$ (where M3=Al, M4=Hf, Zr or Ta, and $z/(z+w)>0.14$) on the gate insulating film by the ALD method or the CVD method; forming a second metal oxide layer and a fourth metal oxide layer on the first metal oxide layer and the third metal oxide layer by the ALD method or the CVD method; forming a first conductive layer and a second conductive layer, respectively on the second metal oxide layer and the fourth metal oxide layer; forming a gate structure by a lithography process and an etching process; and forming source/drain regions for n-MISFETs, and source/drain regions for p-MISFETs, is provided.

According to another aspect of the present invention, a method for fabricating a complementary semiconductor device comprising: forming a gate insulating film on a semiconductor substrate; forming a dummy gate on the gate insulating film; forming source/drain regions for n-MISFETs, and source/drain regions for p-MISFETs; removing the dummy gate; forming a first metal oxide layer having a composition ratio shown with $M1_xM2_yO$ (where M1=Y, La, Ce, Pr, Nd, Sm, Gd, Th, Dy, Ho, Er, Tm, Yb or Lu, M2=Hf, Zr or Ta, and $x/(x+y)>0.12$)on the gate insulating film by an ALD method or a CVD method; forming a third metal oxide layer having a composition ratio shown with $M3_zM4_wO$ (where M3=Al, M4=Hf, Zr or Ta, and $z/(z+w)>0.14$) on the gate insulating film by the ALD method or the CVD method; forming a second metal oxide layer and a fourth metal oxide layer on the first metal oxide layer and the third metal oxide layer by the ALD method or the CVD method; forming a first conductive layer and a second conductive layer, respectively on the second metal oxide layer and the fourth metal oxide layer; and forming a gate structure by a lithography process and an etching process, is provided.

According to the semiconductor device and the fabrication method thereof according to the present invention, the CMISFETs having same gate electrode material and same high permittivity (high-k) dielectric layer for n-/p-MISFETs in a symmetrical flat band voltage $V_{FB}$ (or a threshold voltage $V_{th}$) can be provided, thereby being possible of fabrication of highly efficient semiconductor parts.

BRIEF DESCRIPTION OF DRAWINGS

FIG. 1 shows a semiconductor device according to a first embodiment of the present invention.

FIG. 4A shows an example of $HfO_2/Al_2O_3/SiO_2$ dielectric stack structure, and FIG. 4B shows an example of $Al_2O_3/HfO_2/SiO_2$ dielectric stack structure.

FIG. 6A shows an example of $HfO_2/Al_2O_3/SiO_2$ dielectric stack structure, and FIG. 6B shows an example of $Al_2O_3/HfO_2/SiO_2$ dielectric stack structure.

FIG. 11A shows a comparative example of flat band shift $V_{FB}$ (high-k)–$V_{FB}$ ($SiO_2$) of $n^+$ polysilicon gate p-MOS capacitor having $HfO_2/Al_2O_3/SiO_2$ dielectric stack constructional example, and $Al_2O_3/HfO_2/SiO_2$ dielectric stack constructional example, and FIG. 11B is a mimetic diagram of FLP position in $n^+$ polysilicon gate and $HfO_2$ layer/$Al_2O_3$ layer interface.

DETAILED DESCRIPTION OF THE EMBODIMENTS

Figures 1A, 1B:
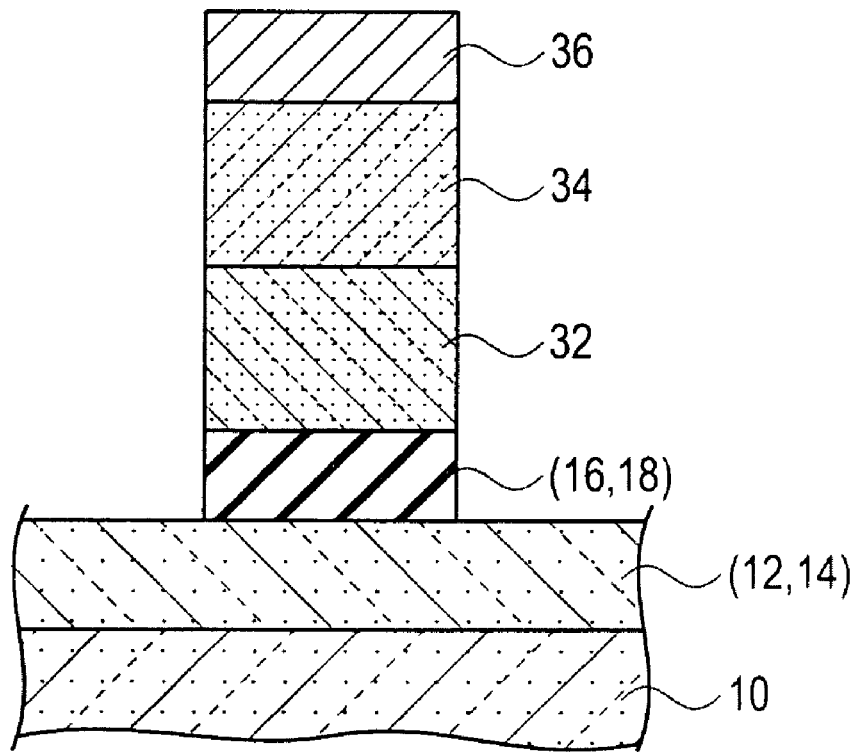
FIG. 1A is a typical section structure view.
FIG. 1B shows an example of combination of material of an upper high permittivity layer 34 and a lower high permittivity layer 32.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment (Element Structure)

Figure 16:
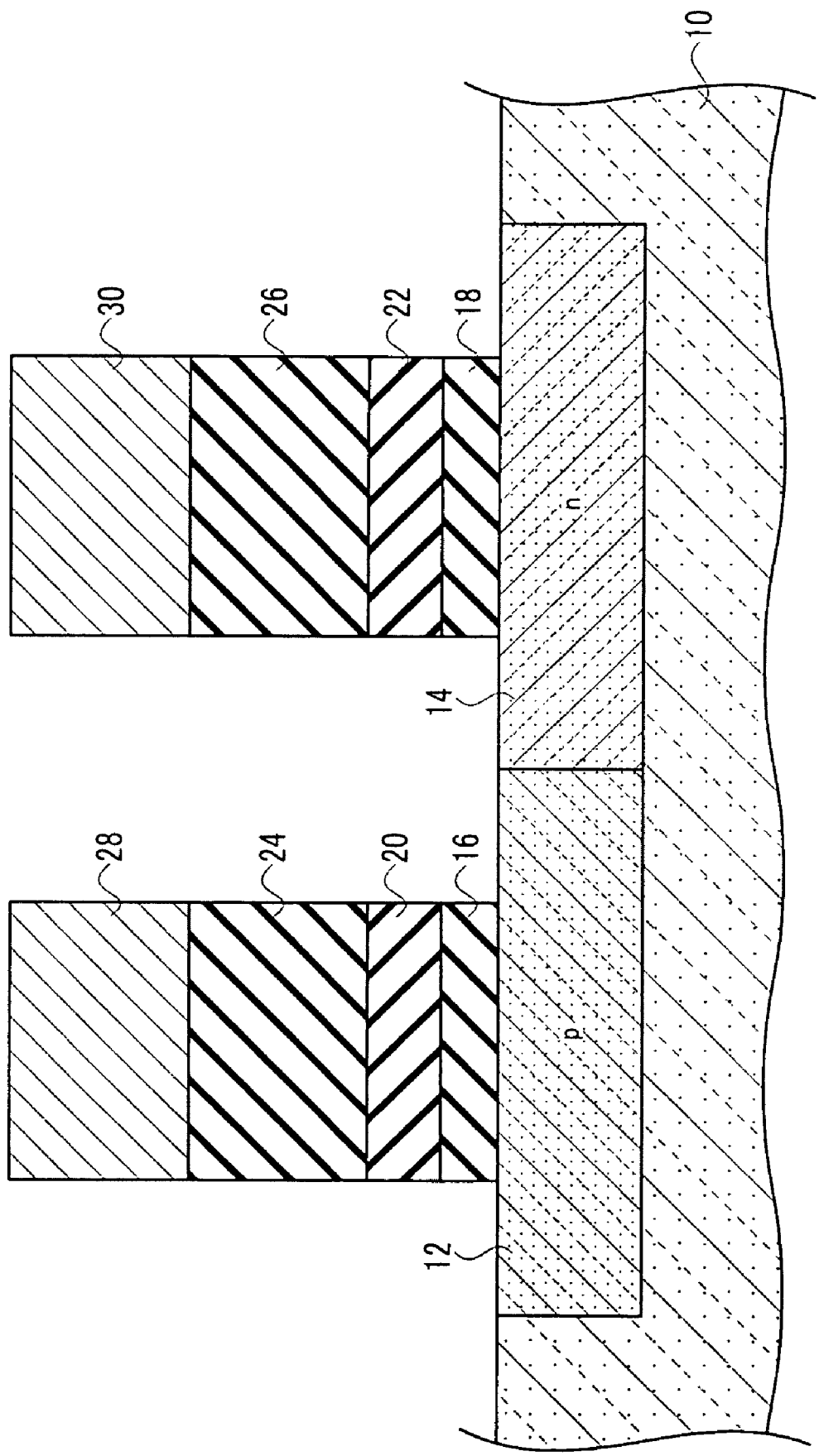
FIG. 16 shows a schematic section structure of the semiconductor device according to the first embodiment of the present invention, and shows a constructional example of CMISFETs.

FIG. 1 shows a semiconductor device according to a first embodiment of the present invention, FIG. 1A shows a schematic section structure view, and FIG. 1B shows an example of combination of the material of an upper high permittivity layer 34 and a lower high permittivity layer 32. FIG. 16 shows a schematic section structure of the semiconductor device according to the first embodiment of the present invention, and shows the constructional example of CMISFETs.

The semiconductor device of the CMISFETs configuration according to the first embodiment of the present invention has the complementary type structure including an n-channel type first MISFETs, and a p-channel type second MISFETs.

As shown in FIG. 1A and FIG. 16, the N-channel type first MISFET includes a first gate insulating film 16, first metal oxide layers (20, 32), second metal oxide layers (24, 34), and first conductive layers (28, 36). The first gate insulating film 16 is placed on the surface of a semiconductor substrate 10. The first metal oxide layers (20, 32) are placed on the first gate insulating film 16, and have the composition ratio expressed with $M1_xM2_yO$ (where M1=Y, La, Ce, Pr, Nd, Sm, Gd, Th, Dy, Ho, Er, Tm, Yb or Lu, M2=Hf, Zr, or Ta, and $x/(x+y)>0.12$). The second metal oxide layers (24, 34) are placed on the first metal oxide layers (20, 32). The first conductive layers (28, 36) are placed on the second metal oxide layers (24, 34).

Similarly, as shown in FIG. 1A and FIG. 16, the p-channel type second MISFET includes a second gate insulating film 18, third metal oxide layers (22, 32), fourth metal oxide layers (26, 34), and second conductive layers (30, 36). The second gate insulating film 18 is placed on the surface of the semiconductor substrate 10. The third metal oxide layers (22, 32) are placed on the second gate insulating film 18, and have the composition ratio expressed with $M3_zM4_wO$ (M3=Al, M4=Hf, Zr, or Ta, and $z/(z+w)>0.14$). The fourth metal oxide layers (26, 34) are placed on the third metal oxide layers (22, 32). The second conductive layers (30, 36) are placed on the fourth metal oxide layers (26, 34).

In the semiconductor device according to the first embodiment of the present invention, the second metal oxide layers (24, 34) may compose one or two elements or more in Zr, Hf, Ta, Y, La, and Al, or may compose the silicated compound material or nitriding silicated compound material of said elements.

Furthermore, the fourth metal oxide layers (26, 34) may compose one or two elements or more in Zr, Hf, Ta, Y, La, and Al, or may compose the silicated compound material or nitriding silicated compound material of said elements.

Furthermore, in the semiconductor device according to the first embodiment of the present invention, in the n-channel type first MISFET and, and the p-channel type second MISFET, the interfacial region composing the first gate insulating film 16 and the first metal oxide layers (20, 32) controls a threshold voltage in the n-channel type first MISFET, and the interfacial region composing the second gate insulating film 18 and said third metal oxide layers (22, 32) controls a threshold voltage in the p-channel type second MISFET.

In the semiconductor device according to the first embodiment of the present invention, the first conductive layers (28, 36) and the second conductive layers (30, 36) compose a single element or two elements or more of Ti, W, Ni, Ta, Pt, Mo, Hf, Ru, or Al, or compose a silicide, a carbide, or a boride of said elements, and a work function of the second conductive layers (30, 36) is characterized by being equal to or more than a work function of the first conductive layers (28, 36).

In the semiconductor device according to the first embodiment of the present invention, as shown in FIG. 1A, the high permittivity (high-k) layers (32, 34) consists of a double layer structure of the upper high permittivity layer 34 and the lower high permittivity layer 32.

As shown in FIG. 1A, the semiconductor device according to the first embodiment of the present invention includes the semiconductor substrate 10, an n-well region 12 or a p-well region 14, the gate insulating films (16, 18), the lower high permittivity layer 32, the upper high permittivity layer 34, and the gate electrode 36. The n-well region 12 or the p-well region 14 is formed on the surface of the semiconductor substrate 10. The gate insulating films (16, 18) are placed on the well regions (12, 14). The lower high permittivity layer 32 is placed on the gate insulating films (16, 18). The upper high permittivity layer 34 is placed on the lower high permittivity layer 32. The gate electrode 36 is placed on the upper high permittivity layer 34.

A silicon substrate is applicable to the semiconductor substrate 10, for example. The n-well region 12 forms elements, such as P, As, and Sb, according to the ion implantation or the diffusion process as opposed to the semiconductor substrate 10. The p-well region 12 forms elements, such as B, Al, Ga, and In, according to the ion implantation or the diffusion process as opposed to the semiconductor substrate 10.

A silicon oxide, a silicon nitride film, a silicon oxynitriding film, etc. are applied to the gate insulating films (16, 18) of the interface, for example.

In the above-mentioned example, the thickness of the gate insulating films (16, 18) is more than 0.3 nm (1 ML), for example, and although it is dependent on an industrial application field, it is 1.5 nm or less actually.

As shown in FIG. 1B, $Al_2O_3$ layer/$HfO_2$ layer, $HfO_2$ layer/ $Al_2O_3$ layer, $Y_2O_3$ layer/$HfO_2$ layer, and $HfO_2$ layer/$Y_2O_3$ layer are applicable to each layer of the lower high permittivity layer 32 and the upper high permittivity layer 34. The combination of $Al_2O_3$ layer/$HfO_2$ layer and $HfO_2$ layer/ $Al_2O_3$ layer is applied to p-MISFETs, and the combination of $Y_2O_3$ layer/$HfO_2$ layer and $HfO_2$ layer/$Y_2O_3$ layer is applied to n-MISFETs. Each layer of $Al_2O_3$ layer/$HfO_2$ layer, $HfO_2$ layer/$Al_2O_3$ layer, $Y_2O_3$ layer/$HfO_2$ layer, and $HfO_2$ layer/ $Y_2O_3$ layer is formed by using the Atomic Layer Deposition (ALD) method.

In the above-mentioned example, about 1.0 nm or more are required for $Al_2O_3$ layer thickness, for example. Although the maximum film thickness is dependent on an application field, even a maximum of about 3.0 nm is tolerable range.

In the above-mentioned example, about 1.0 nm or more is required for $Y_2O_3$ layer thickness, for example. Although the maximum film thickness is dependent on an application field, even a maximum of about 3.0 nm is a tolerable range.

In the above-mentioned example, about 1.0 nm or more is required for $HfO_2$ layer thickness, for example, and not less than about 2.0 nm is preferably required for $HfO_2$ layer thickness.

In addition, the Post Deposition Annealing (PDA) may be performed after film formation of the high permittivity (high-k) gate insulating layers (32, 34), as mentioned later. The aim of this annealing is reforming of membranous qualities, such as reduction of the defect density in the high dielectric constant layers (32, 34). For example, it performs in atmosphere, such as $O_2$, $N_2$, $NH_3$, $H_2$, NO, and $N_2O$, in the range up to about 500 degrees C. to 1075 degrees C. The time period requiring for the annealing process is about 1 second to about 10 seconds. The flash lamp annealing can also be applied, and short-time annealing is also still more possible for reforming of membranous qualities, such as reduction of defect density, in this case.

As a material of the gate electrode 36, NiSi, $Pt_3Si$, W, TaN, $n^+$ polysilicon, etc. are applicable, for example.

In the case of a metal gate, silicide formation is performed, for example at about 500 degrees C. Furthermore, in the case of an $n^+$ polysilicon gate, activation annealing is performed, for example at about 640 degrees C.

In the above-mentioned example, in both the case of a metal gate and in the case of a metal silicide gate, not less than about 20 nm is required for the thickness of the gate electrode 36, for example.

The semiconductor device according to the first embodiment of the present invention shown in FIG. 1A is formed by "GATE SECOND PROCESSING" (refer to FIG. 20) mentioned later.

Figure 2:
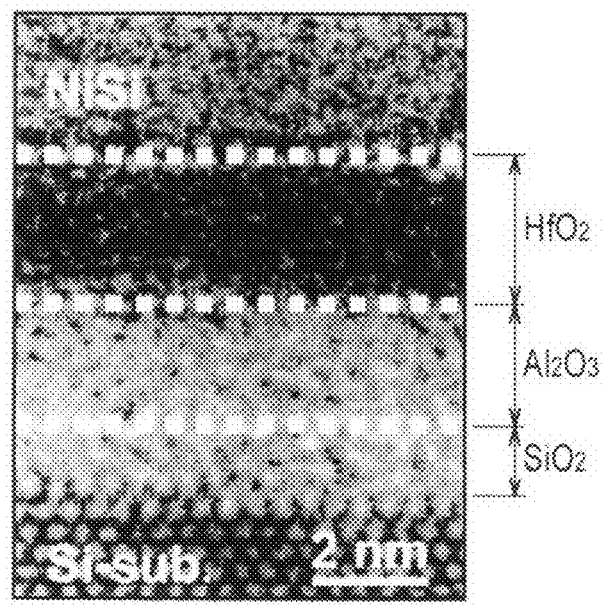
FIG. 2 shows an example of a cross section photograph by a Transmission Electron Microscope (TEM) of the semiconductor device according to the first embodiment of the present invention, corresponding to FIG. 1.

FIG. 2 shows an example of a Transmission Electron Microscope (TEM) cross section photograph of the semiconductor device according to the first embodiment of the present invention corresponding to FIG. 1. The layered structure of the NiSi/$HfO_2$/$Al_2O_3$/$SiO_2$/silicon substrate (Si-sub.) is shown.

As shown in FIG. 2, it is verified that the structure of the high dielectric constant layers (32, 34) of the double layer structure consisting of $HfO_2$/$Al_2O_3$ is maintained after the process of about 500 degrees C. silicide formation.

Figure 3:
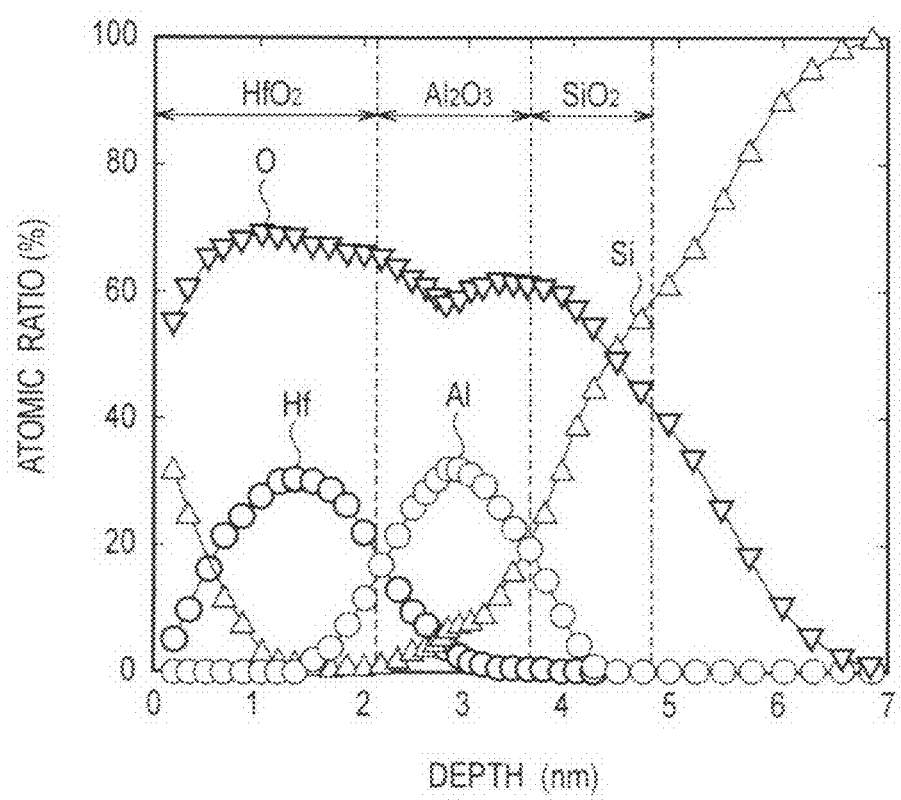
FIG. 3 shows an example of survey of a depth profile by using a high resolution Rutherford back scattering (HR-RBS) analysis method of $HfO_2/Al_2O_3/SiO_2$ dielectric stack structure after a device fabrication process, in a semiconductor device according to the first embodiment of the present invention.

FIG. 3 shows an example of survey of the depth profile using HR-RBS (High Resolution Rutherford Back Scattering) analysis of $HfO_2$/$Al_2O_3$/$SiO_2$ dielectrics layered tructure after the device fabrication process, in the semiconductor device according to the first embodiment of the present invention. The NiSi gate electrode 36 is removed by the wet etching process. The peak of Hf and Al dissociates clearly and is observed, and the diffusion process is not occurred in the atomic layer level, either, as clearly from FIG. 3.

Figure 4:
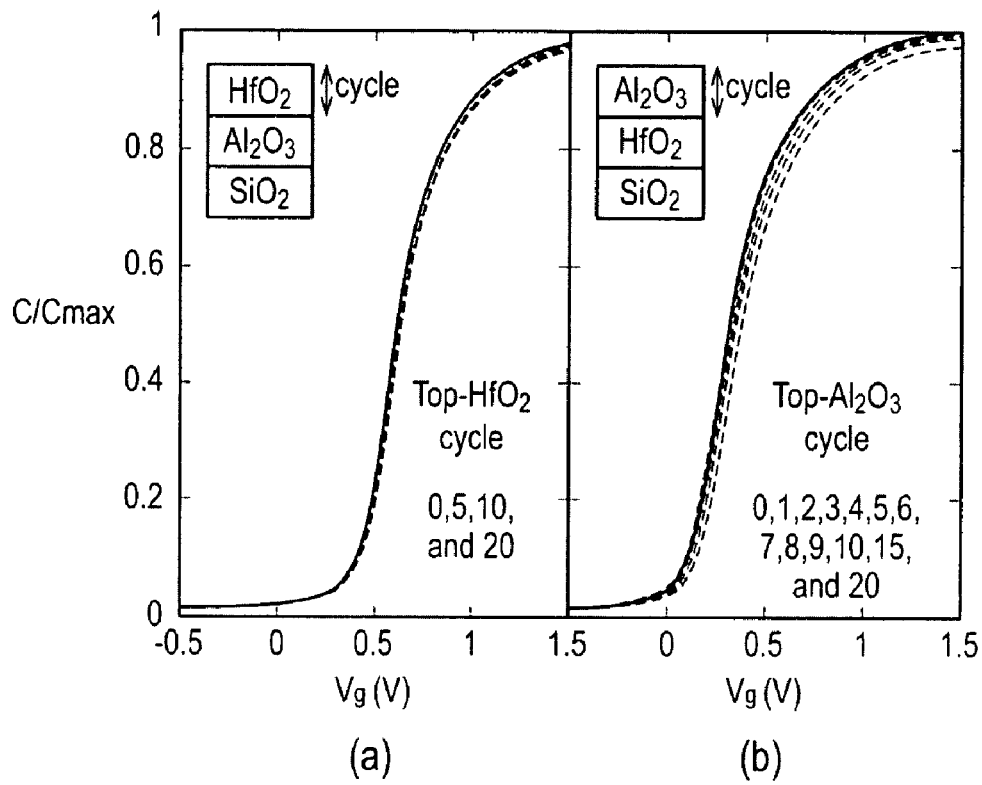
FIG. 4 shows CV characteristics of NiSi gate p-MOS capacitor at the time of making variable an ALD cycle of the upper high permittivity layer in the semiconductor device according to the first embodiment of the present invention.

FIG. 4 shows CV characteristics of a NiSi gate p-MOS capacitor at the time of making variable an ALD cycle of the upper high permittivity layer 34 in the semiconductor device according to the first embodiment of the present invention, FIG. 4A shows an example of $HfO_2$/$Al_2O_3$/$SiO_2$ dielectric stack structure, and FIG. 4B shows an example of $Al_2O_3$/ $HfO_2$/$SiO_2$ dielectric stack structure. In FIG. 4, the film thickness of the upper high permittivity layer 34 is changed by changing the ALD cycle with 0, 5, 10, and 20 cycles. On the other hand, the film thickness of the lower high permittivity layer 32 is uniformly achieved by making the ALD cycle fix to 20 cycles. The thickness of the gate insulating film ($SiO_2$ film) 16 of the interface is about 1.0 nm.

As clearly from FIG. 4A and FIG. 4B, in the both case of $HfO_2$/$Al_2O_3$/$SiO_2$ dielectric stack constructional example and $Al_2O_3$/$HfO_2$/$SiO_2$ dielectric stack constructional example, it proves that there is almost no influence in CV characteristics even when changing the film thickness of the upper high permittivity layer 34.

Figure 5:
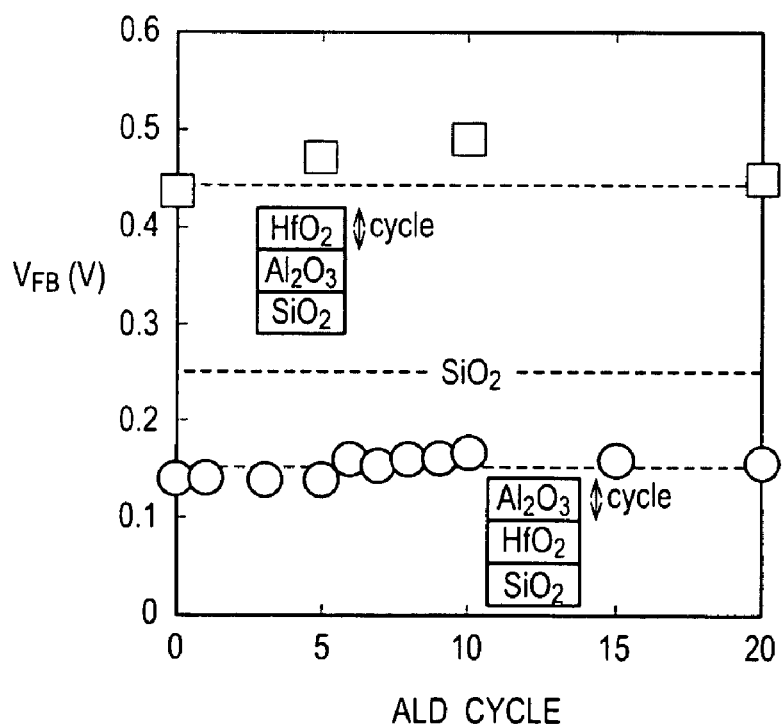
FIG. 5 shows an example of characteristics showing relation between a flat band voltage $V_{FB}$ and the ALD cycle of the upper high permittivity layer in the semiconductor device according to the first embodiment of the present invention.

FIG. 5 shows the relation between the flat band voltage $V_{FB}$ and the ALD cycle of the upper high permittivity layer 34, in the semiconductor device according to the first embodiment of the present invention. Each of $HfO_2$/$Al_2O_3$/$SiO_2$ dielectric stack constructional example and the $Al_2O_3$/$HfO_2$/$SiO_2$ dielectric stack constructional example is shown in FIG. 5 as well as FIG. 4A and FIG. 4B.

As clearly from FIG. 5, in the both case of $HfO_2$/$Al_2O_3$/ $SiO_2$ dielectric stack constructional example and $Al_2O_3$/ $HfO_2$/$SiO_2$ dielectric stack constructional example, it proves that there is almost no influence in $V_{FB}$ characteristics even when changing the film thickness of the upper high permittivity layer 34.

Figure 6:
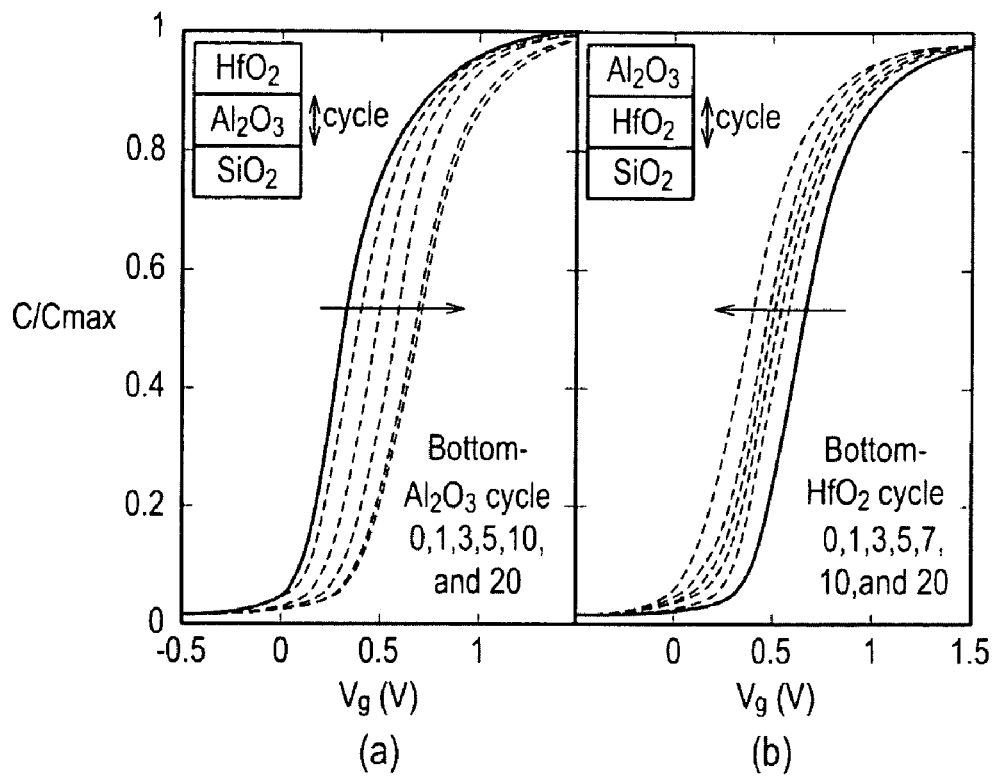
FIG. 6 shows CV characteristics of NiSi gate p-MOS capacitor at the time of making variable an ALD cycle of a lower high permittivity layer in the semiconductor device according to the first embodiment of the present invention.

FIG. 6 shows CV characteristics of the NiSi gate p-MOS capacitor at the time of making variable the ALD cycle of the lower high permittivity layer 32 in the semiconductor device according to the first embodiment of the present invention, FIG. 6A shows an example of $HfO_2$/$Al_2O_3$/$SiO_2$ dielectric stack structure, and FIG. 6B shows an example of $Al_2O_3$/ $HfO_2$/$SiO_2$ dielectric stack structure. In FIG. 6, the film thickness of the lower high permittivity layer 32 is changed by changing the ALD cycle with 0, 1, 3, 5, 7, 10, and 20 cycles. On the other hand, the film thickness of the upper high permittivity layer 34 is uniformly achieved by making the ALD cycle fix to 20 cycles. The thickness of the gate insulating film ($SiO_2$ film) 16 of the interface is about 1.0 nm.

As clearly from FIG. 6A, in the case of $HfO_2$/$Al_2O_3$/$SiO_2$ dielectric stack constructional example, it proves that CV characteristics are shifted in the positive direction when the film thickness of the lower high permittivity layer 32 is changed. Furthermore, as clearly from FIG. 6B, in the case of $Al_2O_3$/$HfO_2$/$SiO_2$ dielectric stack constructional example, it proves that CV characteristics are shifted in the negative direction when the film thickness of the lower high permittivity layer 32 is changed.

Figure 7:
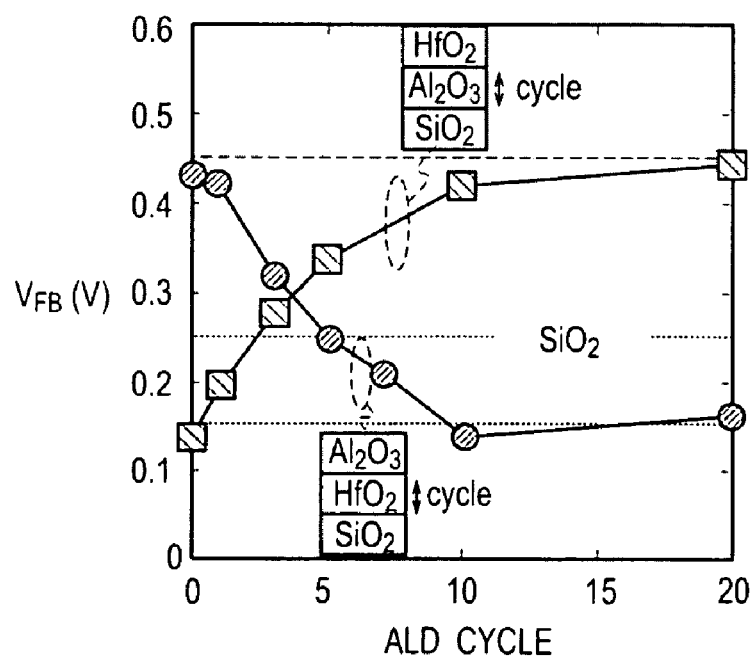
FIG. 7 shows an example of characteristics showing relation between the flat band voltage $V_{FB}$ and the ALD cycle of the lower high permittivity layer in the semiconductor device according to the first embodiment of the present invention.

FIG. 7 shows the relation between the flat band voltage $V_{FB}$ and the ALD cycle of the lower high permittivity layer 32, in the semiconductor device according to the first embodiment of the present invention. Each of $HfO_2$/$Al_2O_3$/$SiO_2$ dielectric stack constructional example and $Al_2O_3$/$HfO_2$/$SiO_2$ dielectric stack constructional example is shown in FIG. 7 as well as FIG. 6A and FIG. 6B.

As clearly from FIG. 7, in the both case of $HfO_2$/$Al_2O_3$/ $SiO_2$ dielectric stack constructional example and $Al_2O_3$/ $HfO_2$/$SiO_2$ dielectric stack constructional example, a remarkable $V_{FB}$ shift is observed when changing the film thickness of the lower high permittivity layer 32, and the $V_{FB}$ shows saturation characteristics at the time where the ALD cycle of the lower high permittivity layer 32 is in about 10 cycles.

Figure 8:
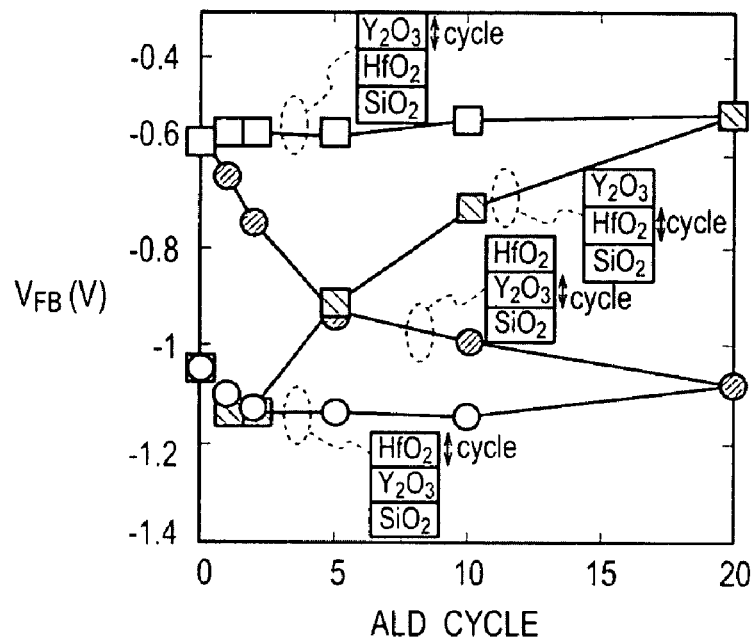
FIG. 8 shows an example of characteristics showing the relation between a flat band voltage $V_{FB}$ of a NiSi gate n-MOS capacitor having $HfO_2/Y_2O_3/SiO_2$ dielectric stack constructional example and $Y_2O_3/HfO_2/SiO_2$ dielectric stack constructional example, and an ALD cycle of $HfO_2$ or $Y_2O_3$, in the semiconductor device according to the first embodiment of the present invention.

FIG. 8 shows an example of characteristics showing the relation between a flat band voltage $V_{FB}$ of a NiSi gate n-MOS capacitor having $HfO_2/Y_2O_3/SiO_2$ dielectric stack constructional example and $Y_2O_3/HfO_2/SiO_2$ dielectric stack constructional example, and the ALD cycle of $HfO_2$ or $Y_2O_3$, in the semiconductor device according to the first embodiment of the present invention. The thickness of the gate insulating film ($SiO_2$ film) 16 of the interface is about 2.5 nm.

As clearly from FIG. 8, in the both case of $HfO_2/Y_2O_3/SiO_2$ dielectric stack constructional example and $Y_2O_3/HfO_2/SiO_2$ dielectric stack constructional example, the remarkable $V_{FB}$ shift is observed when changing the film thickness of the lower high permittivity layer 32. Furthermore, in the both case of $HfO_2/Y_2O_3/SiO_2$ dielectric stack constructional example and $Y_2O_3/HfO_2/SiO_2$ dielectric stack constructional example, it proves that there is almost no influence in $V_{FB}$ characteristics even when changing the film thickness of the upper high permittivity layer 34. This point is the same as that of FIG. 5, and it is the same as that of the result that there is almost no influence in $V_{FB}$ characteristics even when changing the film thickness of the upper high permittivity layer 34 observed in the NiSi gate p-MOS capacitor.

Figure 9:
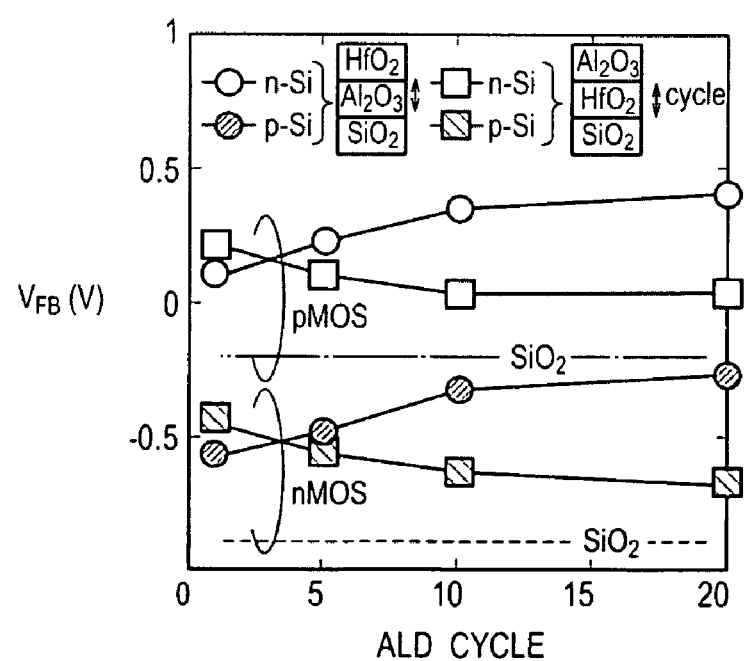
FIG. 9 shows an example of characteristics showing the relation between $n^+$ polysilicon gate n-MOS and the flat band voltage $V_{FB}$ of a p-MOS capacitor having $HfO_2/Al_2O_3/SiO_2$ dielectric stack constructional example and $Al_2O_3/HfO_2/SiO_2$ dielectric stack constructional example, and an ALD cycle of a $HfO_2$ layer or an $Al_2O_3$ layer that is lower high permittivity layers, in the semiconductor device according to the first embodiment of the present invention.

FIG. 9 shows an example of characteristics showing the relation between $n^+$ polysilicon gate n-MOS and the flat band voltage $V_{FB}$ of a p-MOS capacitor having $HfO_2/Al_2O_3/SiO_2$ dielectric stack constructional example and $Al_2O_3/HfO_2/SiO_2$ dielectric stack constructional example, and the ALD cycle of the $HfO_2$ layer or the $Al_2O_3$ layer that is the lower high permittivity layers 32, in the semiconductor device according to the first embodiment of the present invention.

As clearly from FIG. 9, also in the case where it has the $n^+$ polysilicon gate structure, the $V_{FB}$ shift is observed when changing the film thickness of the lower high permittivity layer 32 in the both case of $HfO_2/Al_2O_3/SiO_2$ dielectric stack constructional example and $Al_2O_3/HfO_2/SiO_2$ dielectric stack constructional example. And it is not dependent on the conductivity type of the semiconductor substrate.

Figure 10:
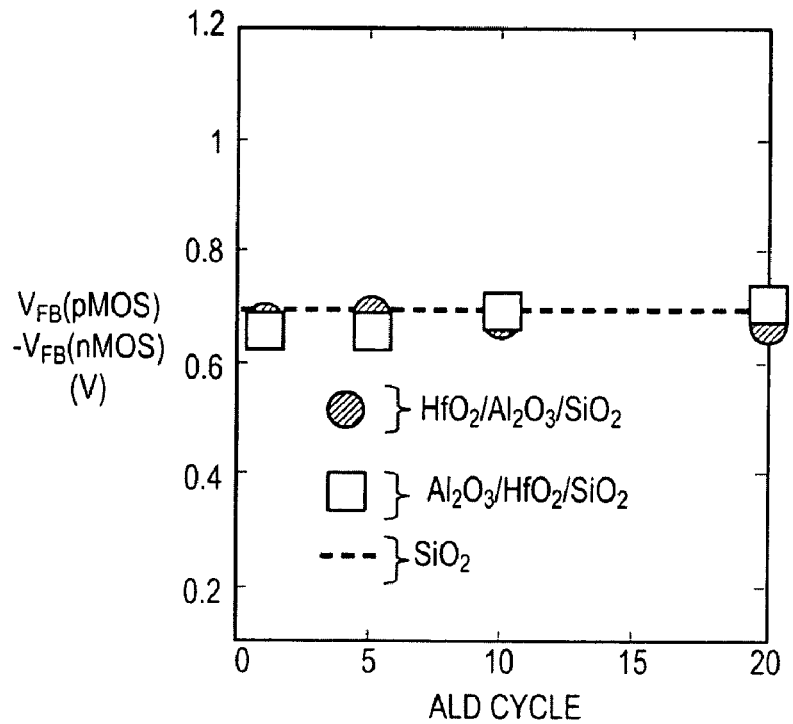
FIG. 10 shows an example of characteristics showing relation between difference voltage $V_{FB}$ (p-MOS)–$V_{FB}$ (n-MOS) of flat band voltage obtained in FIG. 9, and an ALD cycle of a $HfO_2$ layer or an $Al_2O_3$ layer which is lower high permittivity layer, in the semiconductor device according to the first embodiment of the present invention.

FIG. 10 shows an example of characteristics showing relation between difference voltage $V_{FB}$ (p-MOS)–$V_{FB}$ (n-MOS) of flat band voltage obtained in FIG. 9, and the ALD cycle of the $HfO_2$ layer or the $Al_2O_3$ layer which is lower high permittivity layer, in the semiconductor device according to the first embodiment of the present invention.

As clearly from FIG. 10, in the both case of $HfO_2/Al_2O_3/SiO_2$ dielectric stack constructional example and $Al_2O_3/HfO_2/SiO_2$ dielectric stack constructional example, the value of difference voltage $V_{FB}$ (p-MOS)–$V_{FB}$ (n-MOS) of flat band voltage shows the almost same value. Moreover, the value of difference voltage $V_{FB}$ (p-MOS)–$V_{FB}$ (n-MOS) of such flat band voltage is approximately in agreement with the difference voltage of the Fermi level of the silicon substrate. This proves that the interaction does not exist between the high permittivity (high-k) layers (32, 34)/gate insulating layers (16, 18) interface and the silicon semiconductor substrate 10.

Figure 11:
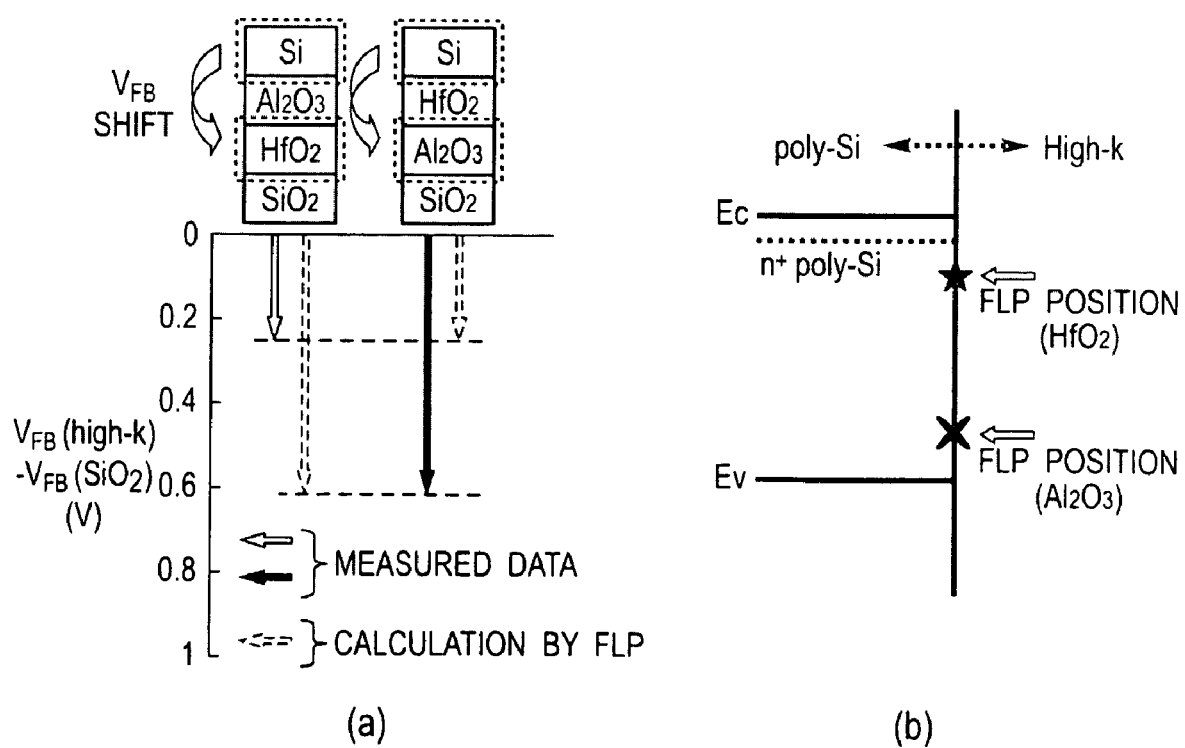
FIG. 11 shows the semiconductor device according to the first embodiment of the present invention.

FIG. 11A shows a comparative example of flat band shift $V_{FB}$ (high-k)–$V_{FB}$ ($S_iO_2$) of the $n^+$ polysilicon gate p-MOS capacitor having $HfO_2/Al_2O_3/SiO_2$ dielectric stack constructional example, and $Al_2O_3/HfO_2/SiO_2$ dielectric stack constructional example in the semiconductor device according to the first embodiment of the present invention, and FIG. 11B shows a mimetic diagram of FLP position in the $n^+$ polysilicon gate and the $HfO_2$ layer/$Al_2O_3$ layer interface.

As clearly from FIG. 11A and FIG. 11B, it proves that the flat band voltage $V_{FB}$ of $n^+$ polysilicon gate p-MOS capacitor, having $HfO_2/Al_2O_3/SiO_2$ dielectric stack constructional example and $Al_2O_3/HfO_2/SiO_2$ dielectric stack constructional example, is determined by the $HfO_2$ layer or $Al_2O_3$ layer which is the lower high permittivity layer 32.

Figure 12:
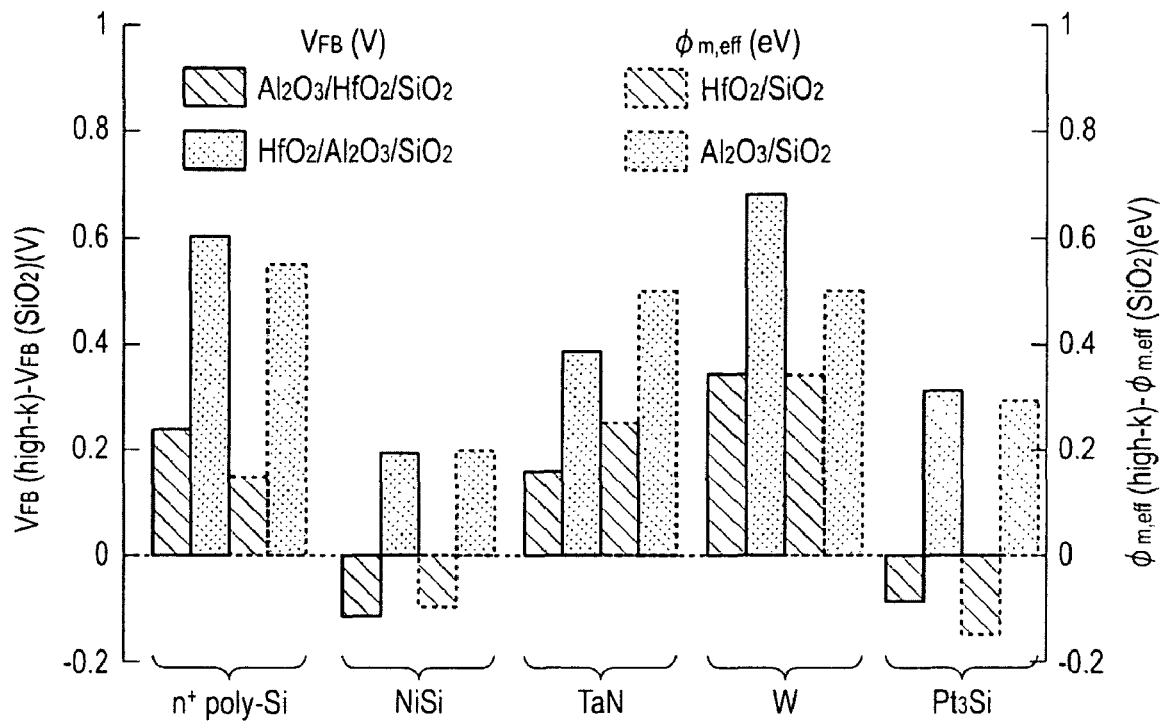
FIG. 12 shows a comparative example of flat band shift $V_{FB}$ (high-k)–$V_{FB}$ ($SiO_2$), and effective work function shift $\Phi_{m,\;eff}$ (high-k)–$\Phi_{m,\;eff}$ ($SiO_2$) (eV), in $HfO_2/Al_2O_3/SiO_2$ dielectric stack constructional example and $Al_2O_3/HfO_2/SiO_2$ dielectric stack constructional example at the time of various changing the gate electrode structure, in the semiconductor device according to the first embodiment of the present invention.

FIG. 12 shows a comparative example of flat band shift $V_{FB}$ (high-k)–$V_{FB}$ ($SiO_2$), and effective work function shift $\Phi_{m,\,eff}$ (high-k)–$\Phi_{m,\,eff}$ ($SiO_2$) (eV), in $HfO_2/Al_2O_3/SiO_2$ dielectric stack constructional example and $Al_2O_3/HfO_2/SiO_2$ dielectric stack constructional example at the time of various changing the gate electrode structure, in the semiconductor device according to the first embodiment of the present invention.

As clearly from FIG. 12, the tendency of flat band shift $V_{FB}$ (high-k)–$V_{FB}$ ($SiO_2$) and effective work function shift $\Phi_{m,\,eff}$ (high-k)–$\Phi_{m,\,eff}$ ($SiO_2$) is well in agreement. In particular, the tendency of flat band shift $V_{FB}$ (high-k)–$V_{FB}$ ($SiO_2$) in $HfO_2/Al_2O_3/SiO_2$ dielectric stack constructional example and $Al_2O_3/HfO_2/SiO_2$ dielectric stack constructional example is well in agreement with the tendency of effective work function shift $\Phi_{m,\,eff}$ (high-k)–$\Phi_{m,\,eff}$ ($SiO_2$) in $HfO_2/SiO_2$ dielectric stack constructional example and $Al_2O_3/SiO_2$ dielectric stack constructional example.

From this, in the flat band voltage $V_{FB}$ of the MOS capacitors of various gate structures having $HfO_2/Al_2O_3/SiO_2$ dielectric stack constructional example and $Al_2O_3/HfO_2/SiO_2$ dielectric stack constructional example, it proves that the $HfO_2$ layer or $Al_2O_3$ layer which is the lower high permittivity layer 32 performs important work. In particular, it proves that the lower high permittivity layer 32 and the gate insulating layer ($SiO_2$) interface perform important work for the $V_{FB}$ shift.

Figure 13:
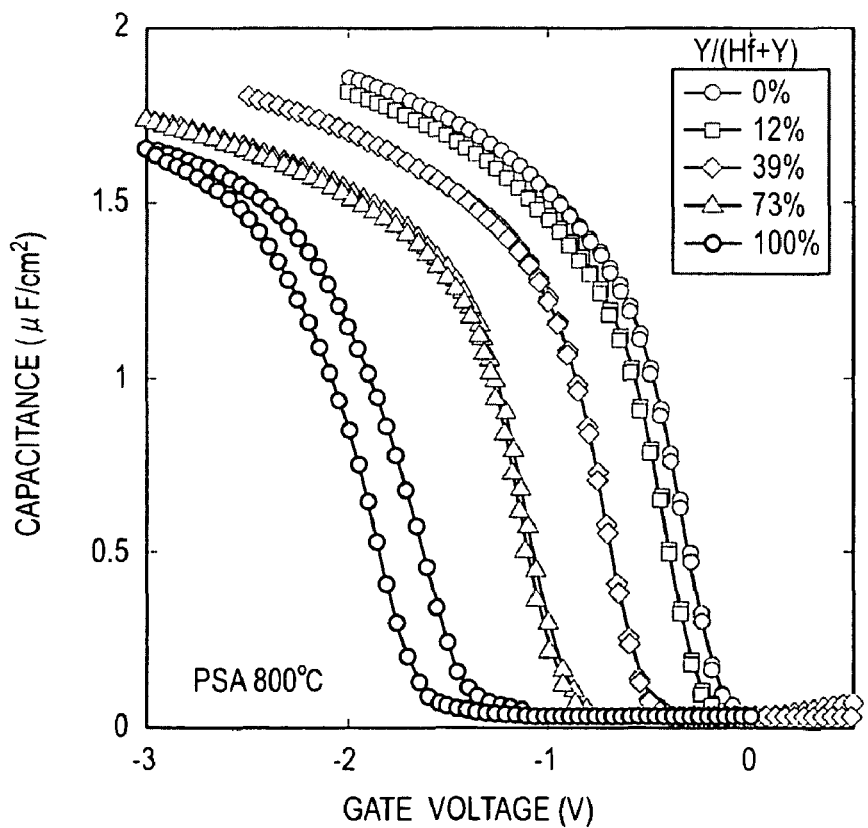
FIG. 13 shows an example of characteristics showing relation between a gate capacitance of n-MISFETs having HfYO dielectric structure and gate voltage at the time of changing Y concentration, in the semiconductor device according to the first embodiment of the present invention.

FIG. 13 shows an example of characteristics showing relation between the gate capacitance of n-MISFETs having $HfO_2/Y_xHf_yO/SiO_2$ dielectric structure and the gate voltage, in the semiconductor device according to the first embodiment of the present invention.

As clearly from FIG. 13, when the $Y_xHf_yO$ layer to which Y concentration is changed as the lower high permittivity layer 32 is applied, the control of the flat band voltage $V_{FB}$ is possible also by controlling Y concentration just above the gate insulating layer (16) in n-MISFETs. As clearly from FIG. 13, in composition of $Y_xHf_yO$, if $x/(x+y)>0.12$ is satisfied, the control of the flat band voltage $V_{FB}$ is possible.

Figure 14:
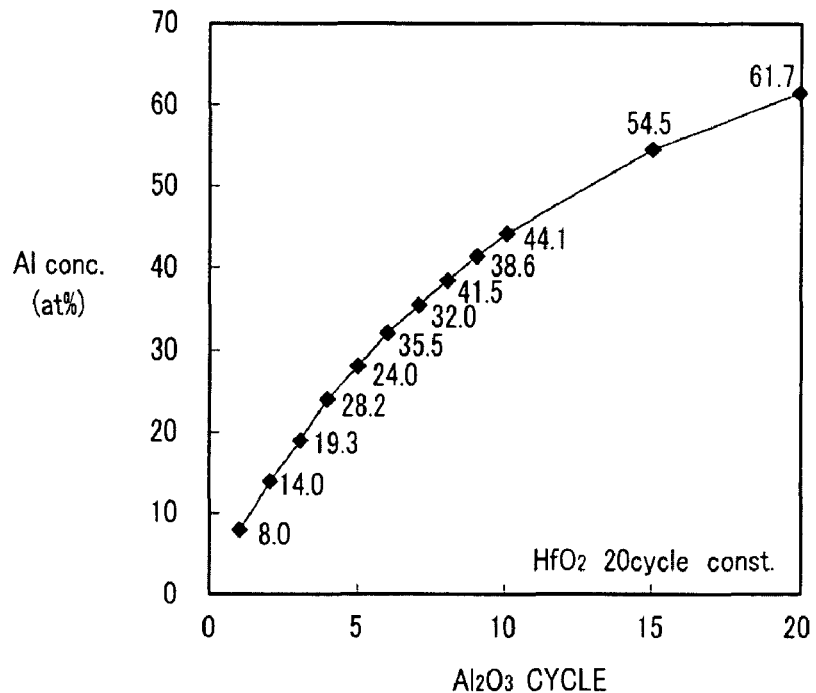
FIG. 14 shows an example of characteristics showing relation between an ALD cycle of an $Al_2O_3$ layer and Al concentration at the time of set of an ALD cycle of $HfO_2$ layer constant, in the semiconductor device according to the first embodiment of the present invention.

FIG. 14 shows the relation between the ALD cycle of the $Al_2O_3$ layer at the time of seting the ALD cycle of the $HfO_2$ layer constant in 20 cycles and Al concentration in p-MISFETs having $HfO_2/Al_2O_3/SiO_2$ dielectric structure example, in the semiconductor device according to the first embodiment of the present invention.

As clearly from the tendency of FIG. 14, along with the ALD cycle of the $Al_2O_3$ layer which is the lower high permittivity layer 32 rising from 0 to 20 cycle, the Al concentration is increasing from 0 to about 61.7%. Referring to FIG. 6A at this point, if the ALD cycle of the $Al_2O_3$ layer is raised in order to change the film thickness of the lower high permittivity layer 32 in the case of $HfO_2/Al_2O_3/SiO_2$ dielectric stack constructional example, the CV characteristics is notably shifted in the positive direction. Therefore, it proves that the control of the flat band voltage $V_{FB}$ of p-MISFETs is possible by controlling the ALD cycle of the $Al_2O_3$ layer which is the lower high permittivity layer 32 and controlling the Al concentration.

Therefore, in the semiconductor device according to the first embodiment of the present invention, it is proves that the control of the flat band voltage $V_{FB}$ is possible by controlling the Al concentration also in p-MISFETs having $HfO_2/Al_zH-f_wO/SiO_2$ dielectric structure example as well as the case of n-MISFETs shown in FIG. 13. As clearly from FIG. 14 and FIG. 6A, if $z/(z+w) \geq 0.14$ is satisfied, in the composition of $Al_zHf_wO$, the control of the flat band voltage $V_{FB}$ is possible.

Figure 15:
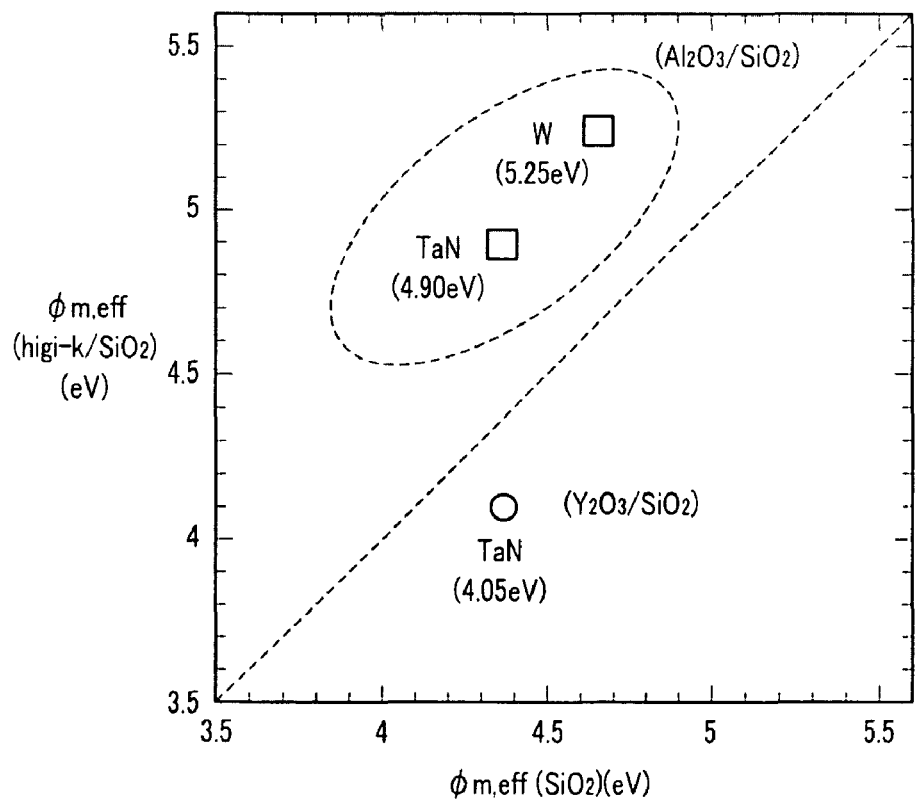
FIG. 15 is a figure showing the relation between effective work function $\Phi_{m,\;eff}$(high-k/$SiO_2$) on high-k/$SiO_2$ and effective work function $\Phi_{m,\;eff}$ ($SiO_2$) on $SiO_2$, and shows the characteristic data of TaN and W on $Al_2O_3/SiO_2$, and TaN on $Y_2O_3/SiO_2$, in the semiconductor device according to the first embodiment of the present invention.

FIG. 15 is a figure showing the relation between effective work function $\Phi_{m, eff}$(high-k/$SiO_2$) on high-k/$SiO_2$ and effective work function $\Phi_{m, eff}$ ($SiO_2$) on $SiO_2$, and shows the measured data of effective work function $\Phi_{m, eff}$ (high-k/$SiO_2$) of TaN and W on $Al_2O_3/SiO_2$ and effective work function $\Phi_{m, eff}$(high-k/$SiO_2$) of TaN on $Y_2O_3/SiO_2$, in the semiconductor device according to the first embodiment of the present invention.

CMISFETs can be composed from the measured data of FIG. 15 based on effective work function $\Phi_{m, eff}$ on the $Al_2O_3/SiO_2$ layer and the $Y_2O_3/SiO_2$ layer. That is, the effective work function which can realize CMISFETs having the high permittivity (high-k) layers (32, 34) is obtained by having $HfO_2/Y_2O_3/SiO_2$ dielectric stack structure in n-MISFETs, having $HfO_2/Al_2O_3/SiO_2$ dielectric stack structure in p-MISFETs, and using heat-resistant high TaN for the gate electrode material in common.

As shown in FIG. 16, in the semiconductor device of the CMISFETs configuration according to the first embodiment of the present invention, the gate structure of n-MISFETs is provided with TaN/$HfO_2$/$Y_2O_3$/$SiO_2$ structure, and the gate structure of p-MISFETs is provided with TaN/$HfO_2$/$Al_2O_3$/$SiO_2$ structure.

As shown in FIG. 16, in the semiconductor device of the CMISFETs configuration according to the first embodiment of the present invention, n-MISFETs include the semiconductor substrate 10, the p-well region 12 formed on the surface of the semiconductor substrate 10, the gate insulating film 16 placed on the p-well region 12, the $Y_2O_3$ layer 20 placed on the gate insulating film 16, the $HfO_2$ layer 24 placed on the $Y_2O_3$ layer 20, and the TaN electrode 28 placed on the $HfO_2$ layer 24. Furthermore, as shown in FIG. 16, p-MISFETs include the semiconductor substrate 10, the n-well region 14 formed on the surface of the semiconductor substrate 10, the gate insulating film 18 placed on the n-well region 14, the $Al_2O_3$ layer 22 placed on the gate insulating film 18, the $HfO_2$ layer 26 placed on the $Al_2O_3$ layer 22, and the TaN electrode 30 placed on the $HfO_2$ layer 26.

Figure 17:
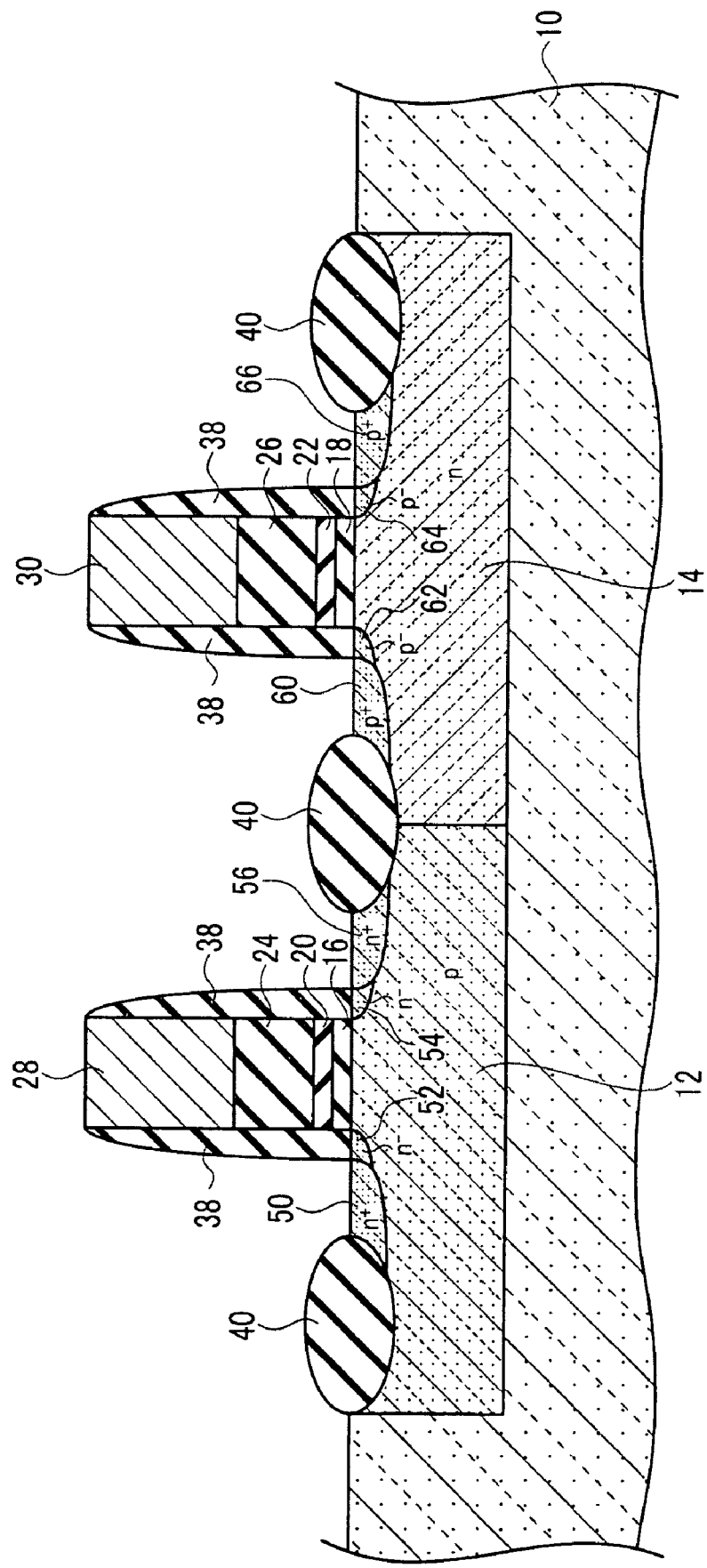
FIG. 17 shows a detailed schematic section structure of the semiconductor device related to the first embodiment of the present invention, and shows a constructional example of CMISFETs.

FIG. 17 shows the detailed schematic section structure of the semiconductor device according to the first embodiment of the present invention, and shows a constructional example of CMISFETs. A source/drain region of MISFETs, a sidewall insulating film 38, and a LOCOS insulating film 40, which are omitted illustration in FIG. 16, are shown in FIG. 17.

The source region of n-MISFETs is shown with an $n^+$ diffusion layer 50, and the drain region of n-MISFETs is shown with an $n^+$ diffusion layer 56. $N^-$ diffusion layers 52 and 54 are the high resistance layers for realizing Lightly Doped Drain (LDD) structure. The source region of p-MISFETs is shown with a $p^+$ diffusion layer 60, and the drain region of p-MISFETs is shown with a $p^+$ diffusion layer 66. $P^-$ diffusion layers 62 and 64 are the high resistance layers for realizing LDD structure.

(Modified Example)

Figure 18:
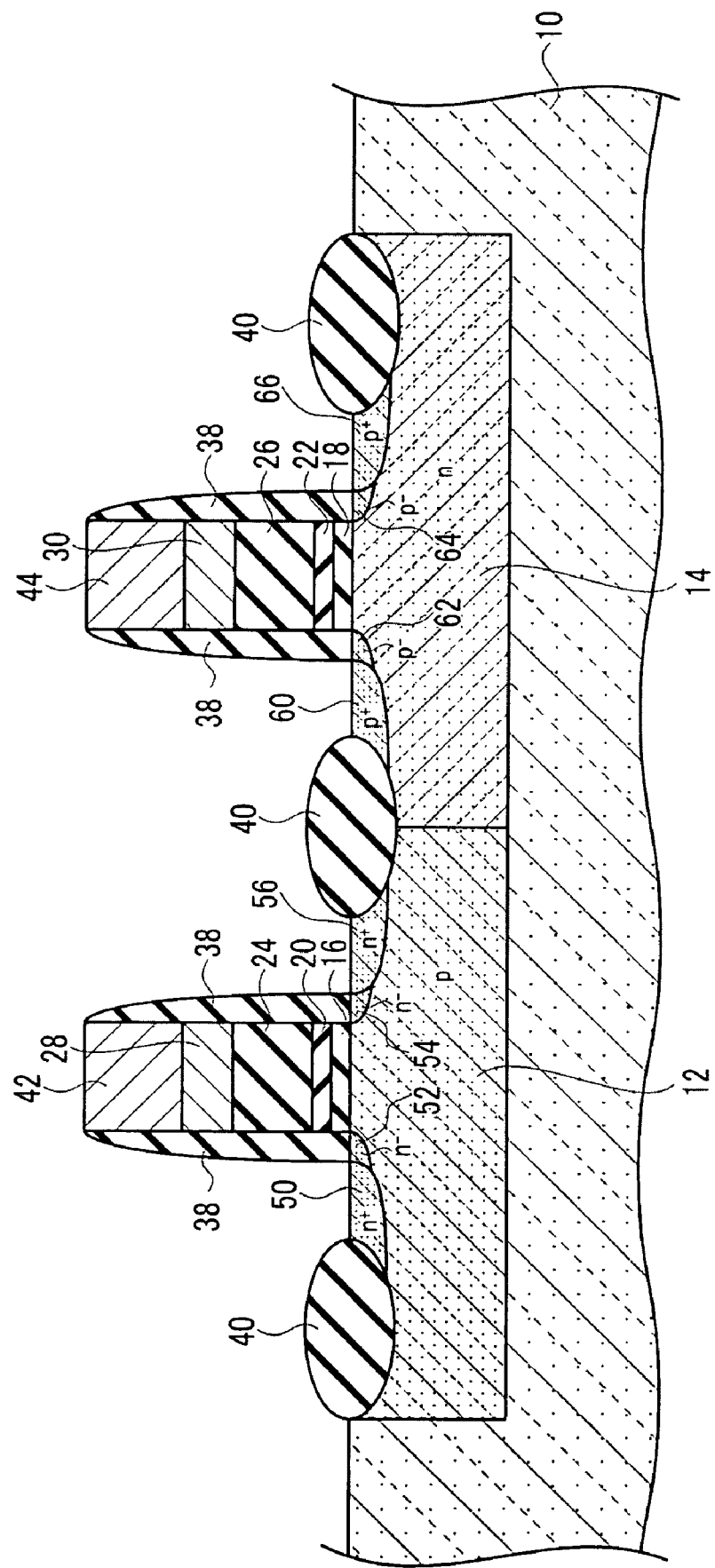
FIG. 18 shows a detailed schematic section structure of the semiconductor device according to a modified example of the first embodiment of the present invention, and shows a constructional example of CMISFETs.

FIG. 18 shows the detailed schematic section structure of a semiconductor device according to a modified example of the first embodiment of the present invention, and shows another constructional example of CMISFETs.

In the semiconductor device of the CMISFETs configuration according to the modified example of the first embodiment of the present invention, as shown in FIG. 18, the gate structure of n-MISFETs is provided with NiSi/TaN/$HfO_2$/$Y_2O_3$/$SiO_2$ structure, and the gate structure of p-MISFETs is provided with TaN/$HfO_2$/$Al_2O_3$/$SiO_2$ structure.

In the semiconductor device of the CMISFETs configuration according to the modified example of the first embodiment of the present invention, as shown in FIG. 18, n-MISFETs include the semiconductor substrate 10, the p-well region 12 formed on the surface of the semiconductor substrate 10, the gate insulating film 16 placed on the p-well region 12, the $Y_2O_3$ layer 20 placed on the gate insulating film 16, the $HfO_2$ layer 24 placed on the $Y_2O_3$ layer 20, and the TaN electrode 28 placed on the $HfO_2$ layer 24. Furthermore, as shown in FIG. 18, p-MISFETs include the semiconductor substrate 10, the n-well region 14 formed on the surface of the semiconductor substrate 10, the gate insulating film 18 placed on the n-well region 14, the $Al_2O_3$ layer 22 placed on the gate insulating film 18, the $HfO_2$ layer 26 placed on the $Al_2O_3$ layer 22, and the TaN electrode 30 placed on the $HfO_2$ layer 26. In addition, the source/drain region of MISFETs, the sidewall insulating film 38, and the LOCOS insulating film 40 are shown in FIG. 17. The source region of n-MISFETs is shown with the $n^+$ diffusion layer 50, and the drain region of n-MISFETs is shown with the $n^+$ diffusion layer 56. The $n^-$ diffusion layers 52 and 54 are the high resistance layers for realizing LDD structure. The source region of p-MISFETs is shown with the $p^+$ diffusion layer 60, and the drain region of p-MISFETs is shown with the $p^+$ diffusion layer 66. The $p^-$ diffusion layers 62 and 64 are the high resistance layers for realizing LDD structure.

In the n-MISFETs, the gate insulating film 16 on the silicon semiconductor substrate 10 is formed by $SiO_2$ about 1.0 nm thick, the $Y_2O_3$ layer 20 placed on the gate insulating film 16 is formed in about 1.0 nm thick, and the $HfO_2$ layer 24 placed on the $Y_2O_3$ layer 20 is formed in about 2.0 nm thick.

In the p-MISFETs, the gate insulating film 18 on the silicon semiconductor substrate 10 is formed by $SiO_2$ about 1.0 nm thick, the $Al_2O_3$ layer 22 placed on the gate insulating film 18 is formed in about 1.0 nm thick, and the $HfO_2$ layer 26 placed on the $Al_2O_3$ layer 22 is formed in about 2.0 nm thick. At this time, all the high permittivity (high-k) dielectric layers (32, 34) are formed by the ALD method or the Chemical Vapor Deposition (CVD) method, and the TaN gate electrodes 28 and 30 are formed by the Physical Vapor Deposition (PVD) method. Furthermore, the NiSi gate electrodes 42 and 44 are formed by the Fully Silicided (FUSI) process, and are performed by the PGA process after passing through the wiring process, thereby forming n-/p-MISFETs. Hereinafter, a fabrication method will be explained in detail.

(Fabrication Method)

Figure 19:
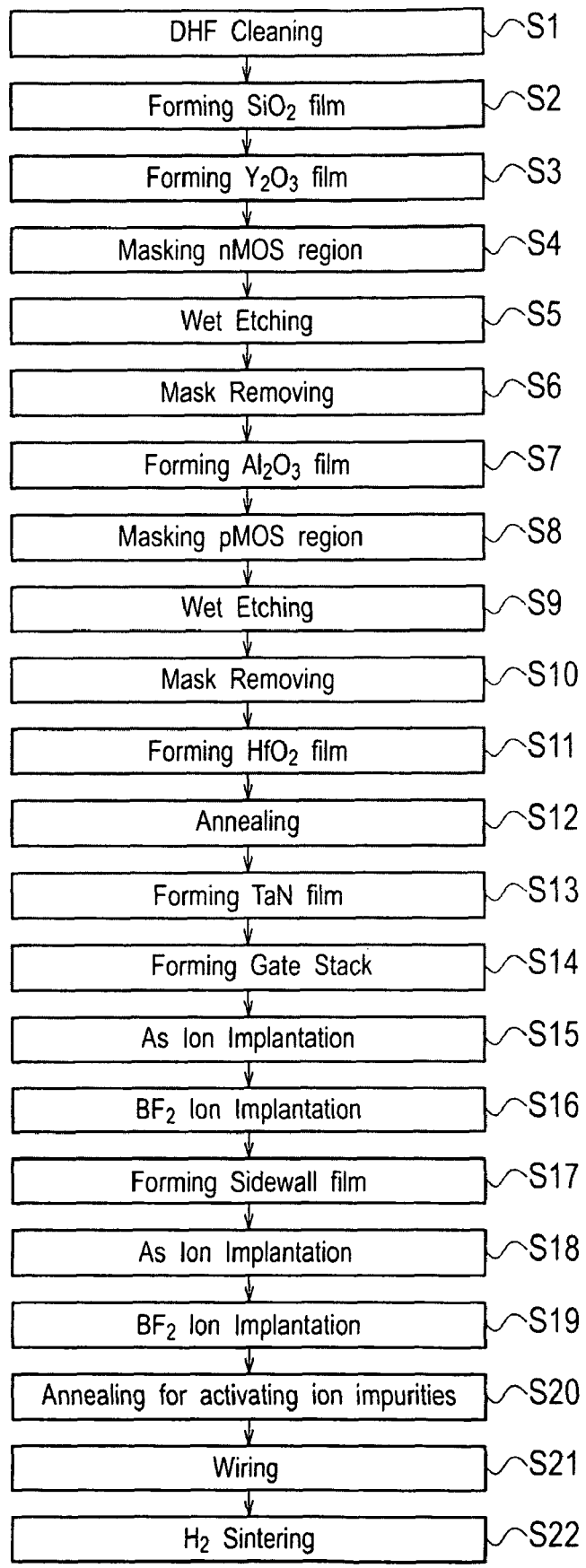
FIG. 19 shows a fabrication method of the semiconductor device related to the first embodiment of the present invention, and shows a flow chart of Gate First Processing.
Figure 20:
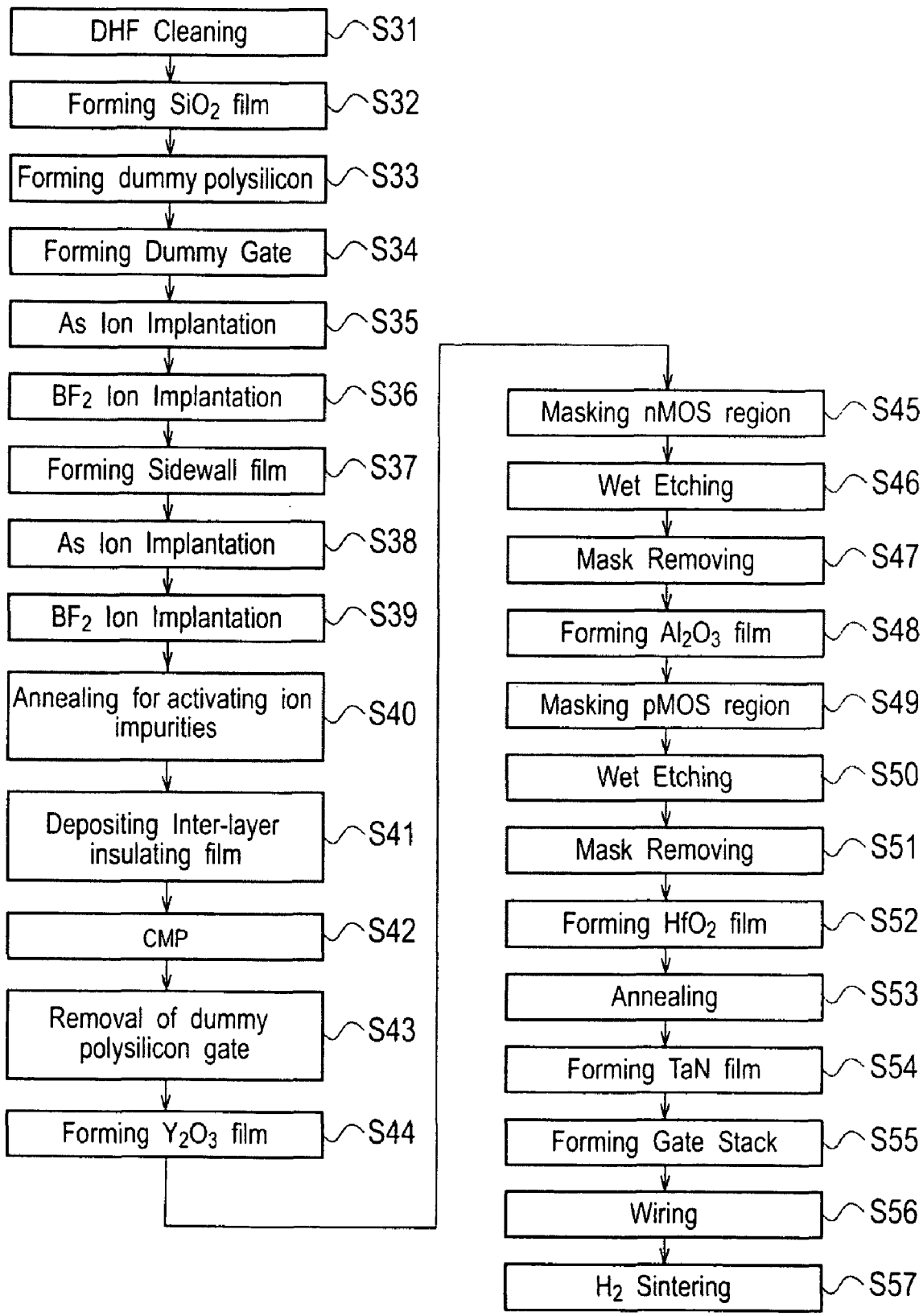
FIG. 20 shows another fabrication method of the semiconductor device according to the first embodiment of the present invention, and shows a flow chart of Gate Second Processing.

FIG. 19 shows a fabrication method of the semiconductor device according to the first embodiment of the present invention, and shows a flow chart of a "GATE FIRST PROCESSING". On the other hand, FIG. 20 shows another fabrication method of the semiconductor device according to the first embodiment of the present invention, and shows a flow chart of a "GATE SECOND PROCESSING".

In this specification, the "GATE FITST PROCESSING" means that firstly gate electrodes for the n-MOS and p-MOSFETs are formed and secondary the source/drain regions for the n-MOS and p-MOSFETs are formed through an ion-implantation process. Furthermore, the "GATE SECOND PROCESSING" means that firstly the source/drain regions for the n-MOS and p-MOSFETs are formed through the ion-implantation process and gate electrodes for the n-MOS and p-MOSFETs are formed secondary.

<Gate First Processing>

With reference to FIG. 19, a fabrication method by the gate first processing of the semiconductor device according to the first embodiment of the present invention will be explained. The fabricating process from insulating film formation will be explained.

(a) First of all, in Step S1, the semiconductor substrate 10 is performed the DHF cleaning by using the rare fluoric acid (DHF) which diluted fluoric acid (HF) with pure water.

(b) Next, in Step S2, the gate insulating films 16 and 18 which consist of SiO2 is formed by the RTA (Rapid Thermal Annealing) process.

(c) Next, in Step S3, the $Y_2O_3$ layer 20 is formed on the gate insulating film 16 by the ALD method or the CVD method.

(d) Next, in Step S4, the n-MOS region is masked by using a resist as a mask.

(e) Next, in Step S5, the $Y_2O_3$ layer 20 of the p-MOS region is removed by the wet etching. As the wet etching liquid, HF, $H_2O_2$, an alkali solution, etc. can be used, for example.

(f) Next, in Step S6, the mask is removed by the ashing process etc.

(g) Next, in Step S7, the $Al_2O_3$ layer 22 is formed on the gate insulating film 18 by the ALD method or the CVD method.

(h) Next, in Step S8, the p-MOS region is masked by using a resist as a mask.

(i) Next, in Step S9, the $Al_2O_3$ layer 22 of the n-MOS region is removed by the wet etching. As the wet etching liquid, HF, $H_2O_2$, an alkali solution, etc. can be used, for example.

(j) Next, in Step S10, the mask is removed by the ashing process etc.

(k) Next, in Step S11, the $HfO_2$ layer 24 and the $HfO_2$ layer 26 are formed respectively on the $Y_2O_3$ layer 20 and the $Al_2O_3$ layer 22 by the ALD method or the CVD method.

(l) Next, in Step S12, the annealing is performed by PDA, RTA, etc. The aim of the annealing (PDA) is to reform of membranous qualities, such as reduction of the defect density in the $Y_2O_3$ layer 20 and the $Al_2O_3$ layer 22. The annealing is performed in atmosphere, such as $O_2$, $N_2$, $NH_3$, $H_2$, NO, and $N_2O$, for example in the range up to about 500 degrees C. to 1075 degrees C. Annealing time period is about 1 second to about 10 seconds. The flash lamp annealing can also be applied, and, in this case, the short-time annealing is also still more possible for reforming of membranous qualities, such as reduction of defect density.

(m) Next, in Step S13, the TaN gate electrodes 28 and 30 are formed by the CVD method or the PVD method.

(n) Next, in Step S14, the gate structure is formed by the photo lithography and the etching process. As a result, the $HfO_2/Y_2O_3/SiO_2$ dielectric stack structure is formed in the n-MOSFETs, and the $HfO_2/Al_2O_3/SiO_2$ dielectric stack structure is formed in the p-MISFETs.

(o) Next, in Step S15, the $n^-$ diffusion layers 52 and 54 which function as the source/drain extension layer for n-MOS is formed by the ion implantation of As.

(p) Next, in Step S16, the $p^-$ diffusion layers 62 and 64 which function as the source/drain extension layer for p-MOS is formed by the ion implantation of $BF_2$.

(q) Next, in Step S17, the $SiO_2$ or $Si_3N_4$ film etc. is formed, and then the sidewall insulating film 38 is formed after an etching process.

(r) Next, in Step S18, the $n^+$ diffusion layers 50 and 56 which function as the source/drain region for n-MOS is formed by the ion implantation of As.

(s) Next, in Step S19, the $p^+$ diffusion layers 60 and 66 which function as the source/drain region for p-MOS is formed by the ion implantation of $BF_2$.

(t) Next, in Step S20, the activation annealing treatment of source/drain is performed. The activation annealing treatment is performed in about 900 degrees C. to about 1075 degrees C., for example. Processing time for the activation annealing treatment is about 5 seconds to about 10 seconds, for example. The flash lamp annealing can also be applied, and, in this case, the short-time annealing is also still more possible.

(u) Next, in Step S21, the electrode wiring process is performed.

(v) Next, in Step S22, the sinter process is performed in $H_2$ atmosphere.

The semiconductor device according to the first embodiment of the present invention can be formed by the gate first processing according to the above fabricating process.

<Gate Second Processing>

Next, with reference to FIG. 20, a fabrication method by the GATE SECOND PROCESSING of the semiconductor device according to the first embodiment of the present invention will be explained. The fabricating process from insulating film formation will be explained.

(a) First of all, in Step S31 the DHF cleaning of the semiconductor substrate 10 is performed.

(b) Next, in Step S32, the gate insulating films 16 and 18 which consist of $SiO_2$ is formed by the RTA process.

(c) Next, in Step S33, a dummy gate is formed. The dummy gate is formed, for example by a polysilicon layer.

(d) Next, in Step S34, the polysilicon gate is formed.

(e) Next, in Step S35, the $n^-$ diffusion layers 52 and 54 which function as the source/drain extension layer for n-MOS are formed by the ion implantation of As.

(f) Next, in Step S36, the $p^-$ diffusion layers 62 and 64 which function as the source/drain extension layer for p-MOS are formed by the ion implantation of $BF_2$.

(g) Next, in Step S37, the $SiO_2$ or $Si_3N_4$ film etc. is formed, and then the sidewall insulating film 38 is formed after the etching process.

(h) Next, in Step S38, the $n^+$ diffusion layers 50 and 56 which function as the source/drain region for n-MOS are formed by the ion implantation of As.

(i) Next, in Step S39, the $p^+$ diffusion layers 60 and 66 which function as the source/drain region for p-MOS are formed by the ion implantation of $BF_2$.

(j) Next, in Step S40, the activation annealing treatment of the source/drain is performed. The activation annealing treatment is performed in about 900 degrees C. to about 1075 degrees C., for example. Processing time for the activation annealing treatment is about 5 seconds to about 10 seconds, for example. The flash lamp annealing can also be applied, and, in this case, the short-time annealing is also still more possible.

(k) Next, in Step S41, an inter-layer insulation film is deposited on all over the device surface. As the inter-layer insulation film, a tetra-ethoxy silane (TEOS) film, a CVD oxide film, a CVD nitride film, or these multilayer films can be used, for example.

(l) Next, in Step S42, the gate outermost surface is exposed by the CMP (Chemical Mechanical Polishing) technology.

(m) Next, in Step S43, the dummy polysilicon gate is removed.

(n) Next, in Step S44, the $Y_2O_3$ layer 20 is formed on the gate insulating film 16 by the ALD method or the CVD method.

(o) Next, in Step S45, the n-MOS region is masked by using a resist as a mask.

(p) Next, in Step S46, the $Y_2O_3$ layer 20 of the p-MOS region is removed by the wet etching. As the wet etching liquid, HF, $H_2O_2$, an alkali solution, etc. can be used, for example.

(q) Next, in Step S47, the mask is removed by the ashing process etc.

(r) Next, in Step S48, the $Al_2O_3$ layer 22 is formed on the gate insulating film 18 by the ALD method or the CVD method.

(s) Next, in Step S49, the p-MOS region is masked by using a resist as a mask.

(t) Next, in Step S50, the $Al_2O_3$ layer 22 of the n-MOS region is removed by the wet etching. As the wet etching liquid, HF, $H_2O_2$, an alkali solution, etc. can be used, for example.

(u) Next, in Step S51, the mask is removed by the ashing process etc.

(v) Next, in Step S52, the $HfO_2$ layer 24 and the $HfO_2$ layer 26 are formed respectively on the $Y_2O_3$ layer 20 and the $Al_2O_3$ layer 22 by the ALD method or the CVD method.

(w) Next, in Step S53, the annealing is performed by PDA, RTA, etc. The aim of the annealing (PDA) is to reform of membranous qualities, such as reduction of the defect density in the $Y_2O_3$ layer 20 and the $Al_2O_3$ layer 22. The annealing is performed in atmosphere, such as $O_2$, $N_2$, $NH_3$, $H_2$, NO, and $N_2O$, for example in the range up to about 500 degrees C. to 1075 degrees C. Annealing time period is about 1 second to about 10 seconds. The flash lamp annealing can also be applied, and, in this case, the short-time annealing is also still more possible for reforming of membranous qualities, such as reduction of defect density.

(x) Next, in Step S54, the TaN gate electrodes 28 and 30 are formed by the CVD method or the PVD method.

(y) Next, in Step S55, the gate structure is formed by the photo lithography and the etching process. As a result, the $HfO_2/Y_2O_3/SiO_2$ dielectric stack structure is formed in the n-MOSFETs, and the $HfO_2/Al_2O_3/SiO_2$ dielectric stack structure is formed in the p-MISFETs.

(z) Next, in Step S56, the electrode wiring process is performed.

(z2) Next, in Step S57, the sinter process is performed in $H_2$ atmosphere.

The semiconductor device according to the first embodiment of the present invention can be formed by the gate second processing according to the above fabricating process.

(Example of Characteristics)

Figure 21:
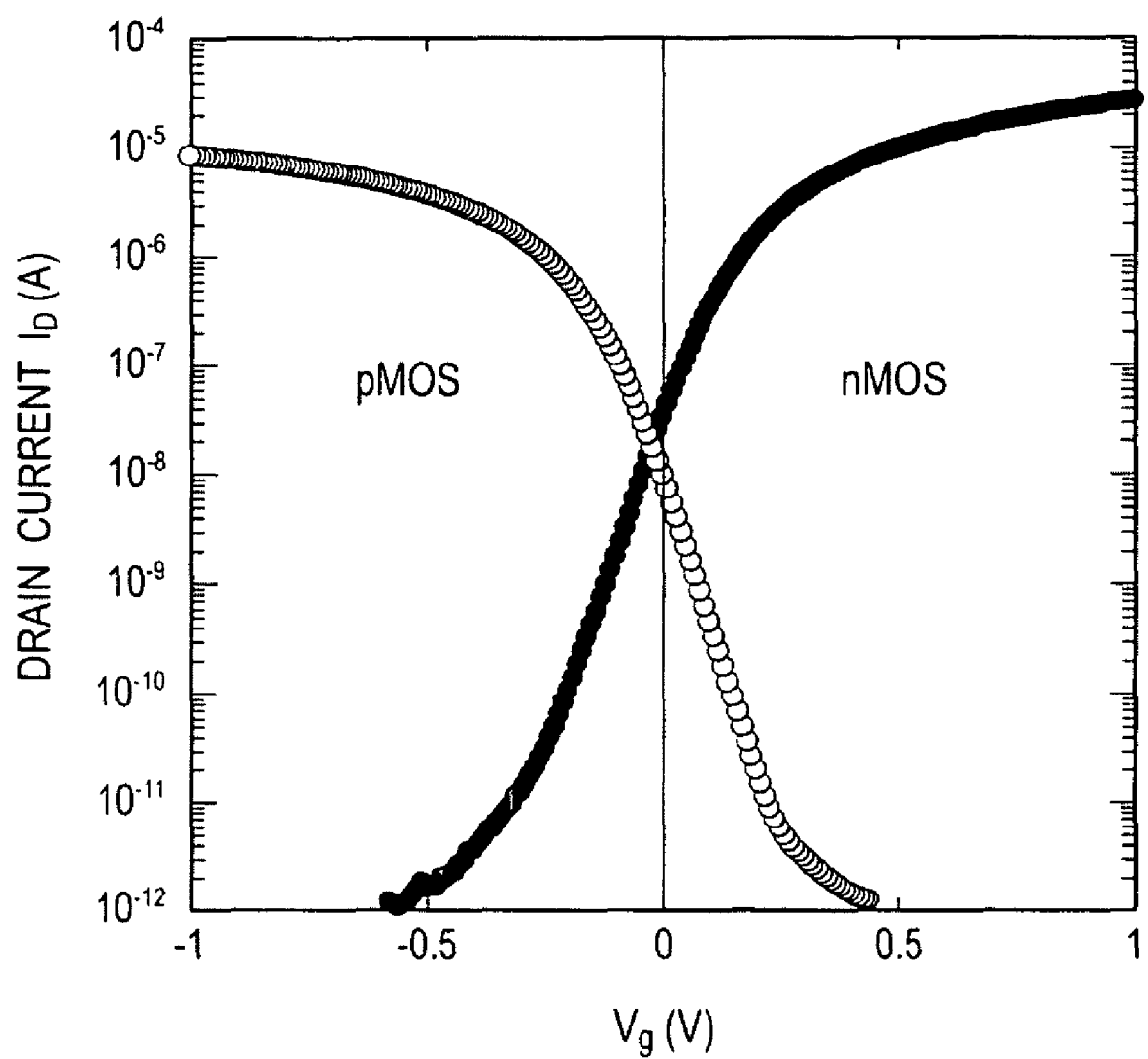
FIG. 21 shows an example of transfer characteristics of CMISFETs of the semiconductor device according to the first embodiment of the present invention.

FIG. 21 shows transfer characteristics of CMISFETs produced by the fabrication method of the semiconductor device according to the first embodiment of the present invention. As clearly from FIG. 21, the p-MISFETs and n-MISFETs having the symmetrical flat band voltage $V_{FB}$ (or threshold voltage $V_{th}$) are formed.

According to the semiconductor device and the fabrication method thereof according to the first embodiment and its modified example of the present invention, the CMISFETs having same gate electrode material and same high permittivity (high-k) dielectric layer for n-/p-MISFETs in a symmetrical flat band voltage $V_{FB}$ (or a threshold voltage $V_{th}$) can be provided, thereby being possible of fabrication of highly efficient semiconductor parts.

Other Embodiments

The present invention has been described by the first embodiment and its modification, as a disclosure including associated description and drawings to be construed as illustrative, not restrictive. With the disclosure, artisan might easily think up alternative embodiments, embodiment examples, or application techniques.

As mentioned above, in the semiconductor device according to the first embodiment of the present invention, the case where the silicon material is applied was described as an example. However, it is not limited to silicon as the material, a silicon carbide, a gallium nitride related semiconductor material, an indium phosphide related semiconductor material, and a gallium arsenide related semiconductor material, etc. can be applied.

Moreover, the device structure may be formed not only in a planar structure but in a vertical structure. Furthermore, it is not limited to the MIS type or the MOS (Metal Oxide Semiconductor) type as the gate structure of the field-effect transistor, but a junction type, a hetero-junction gate type and a Two Dimensional Electron Gas (2DEG) structure may be provided.

Such being the case, the present invention covers a variety of embodiments, whether described or not. Therefore, the technical scope of the present invention is appointed only by the invention specific matter related appropriate scope of claims from the above-mentioned explanation.

INDUSTRIAL APPLICABILITY

The semiconductor device and the fabrication method thereof according to the embodiments of the invention are widely applicable to a super high density integrated circuit, an ultra high-speed logic integrated circuit, etc.

What is claimed is:

1. A complementary semiconductor device comprising:
an n-channel type first MISFET; and
a p-channel type second MISFET,
the n-channel type first MISFET comprising:
a first gate insulating film placed on a semiconductor substrate surface;
a first metal oxide layer placed on the first gate insulating film, and having a composition ratio shown with M1xM2yO (where M1=Y, La, Ce, Pr, Nd, Sm, Gd, Tb, Dy, Ho, Er, Tm, Yb or Lu, M2=Hf, Zr, or Ta, and x/(x+y)>0.12);
a second metal oxide layer placed on the first metal oxide layer; and
a first conductive layer placed on the second metal oxide layer, the p-channel type second MISFET comprises:
a second gate insulating film placed on the semiconductor substrate surface;
a third metal oxide layer placed on the second gate insulating film, and having a composition ratio shown with M3zM4wO (where M3=Al, M4=Hf, Zr, or Ta, and z/(z+w)>0.14);
a fourth metal oxide layer placed on the third metal oxide layer; and
a second conductive layer placed on the fourth metal oxide layer.

2. The complementary semiconductor device according to claim 1, wherein the second metal oxide layer comprises one selected from the group consisting of: a single element or two more elements of Zr, Hf, Ta, Y, La and Al; a silicated compound material of the element; and a nitriding silicated compound material of the element.

3. The complementary semiconductor device according to claim 1, wherein the fourth metal oxide layer comprises one selected from the group consisting of: a single element or two more elements of Zr, Hf, Ta, Y, La and Al; a silicated compound material of the element; and a nitriding silicated compound material of the element.

4. The complementary semiconductor device according to claim 2, wherein the fourth metal oxide layer comprises
one selected from the group consisting of: a single element or two more elements of Zr, Hf, Ta, Y, La and Al; a silicated compound material of the element; and a nitriding silicated compound material of the element.

5. The complementary semiconductor device according to claim 1, wherein
in the n-channel type first MISFET and the p-channel type second MISFET, an interfacial region which comprises the first gate insulating film and the first metal oxide layer controls a threshold voltage in the n-channel type first MISFET, and an interfacial region which comprises the second gate insulating film and the third metal oxide layer controls the threshold voltage in the p-channel type second MISFET.

6. The complementary semiconductor device according to claim 2, wherein
in the n-channel type first MISFET and the p-channel type second MISFET, an interfacial region which comprises the first gate insulating film and the first metal oxide layer controls a threshold voltage in the n-channel type first MISFET, and an interfacial region which comprises the second gate insulating film and the third metal oxide layer controls the threshold voltage in the p-channel type second MISFET.

7. The complementary semiconductor device according to claim 3, wherein
in the n-channel type first MISFET and the p-channel type second MISFET, an interfacial region which comprises the first gate insulating film and the first metal oxide layer controls a threshold voltage in the n-channel type first MISFET, and an interfacial region which comprises the second gate insulating film and the third metal oxide layer controls the threshold voltage in the p-channel type second MISFET.

8. The complementary semiconductor device according to claim 1, wherein
the first conductive layer and the second conductive layer comprise one selected from the group consisting of: a single element or two or more elements of Ti, W, Ni, Ta, Pt, Mo, Hf, Ru, and Al; a silicide of the element; a carbide of the element; and a boride of the element, and
a work function of the second conductive layer is equal to or more than a work function of the first conductive layer.

9. The complementary semiconductor device according to claim 2, wherein
the first conductive layer and the second conductive layer comprise one selected from the group consisting of: a single element or two or more elements of Ti, W, Ni, Ta, Pt, Mo, Hf, Ru, and Al; a silicide of the element; a carbide of the element; and a boride of the element, and
a work function of the second conductive layer is equal to or more than a work function of the first conductive layer.

10. The complementary semiconductor device according to claim 3, wherein
the first conductive layer and the second conductive layer comprise one selected from the group consisting of: a single element or two or more elements of Ti, W, Ni, Ta, Pt, Mo, Hf, Ru, and Al; a silicide of the element; a carbide of the element; and a boride of the element, and
a work function of the second conductive layer is equal to or more than a work function of the first conductive layer.

11. The complementary semiconductor device according to claim 5, wherein
the first conductive layer and the second conductive layer comprise one selected from the group consisting of: a single element or two or more elements of Ti, W, Ni, Ta, Pt, Mo, Hf, Ru, and Al; a silicide of the element; a carbide of the element; and a boride of the element, and
a work function of the second conductive layer is equal to or more than a work function of the first conductive layer.

12. A method for fabricating a complementary semiconductor device comprising:
forming a gate insulating film on a semiconductor substrate;
forming a first metal oxide layer having a composition ratio shown with M1xM2yO (where M1=Y, La, Ce, Pr, Nd, Sm, Gd, Tb, Dy, Ho, Er, Tm, Yb or Lu, M2=Hf, Zr or Ta, and $x/(x+y)>0.12$) on the gate insulating film by ALD or CVD
forming a third metal oxide layer having a composition ratio shown with M3zM4wO (where M3=Al, M4=Hf, Zr or Ta, and $z/(z+w)>0.14$) on the gate insulating film by ALD or CVD;
forming a second metal oxide layer on the first metal oxide layer by ALD or CVD;
forming a fourth metal oxide layer on the third metal oxide layer by ALD or CVD;
forming a first conductive layer on the second metal oxide layer;
forming a second conductive layer on the fourth metal oxide layer;
forming a gate structure by a lithography process and an etching process; and
forming source/drain regions for n-MISFETs, and source/drain regions for p-MISFETs.

13. The method according to claim 12, wherein the second metal oxide layer comprises
one selected from the group consisting of: a single element or two more elements of Zr, Hf, Ta, Y, La and Al; a silicated compound material of the element; and a nitriding silicated compound material of the element.

14. The method according to claim 12, wherein the fourth metal oxide layer comprises
one selected from the group consisting of: a single element or two more elements of Zr, Hf, Ta, Y, La and Al; a silicated compound material of the element; and a nitriding silicated compound material of the element.

15. The method according to claim 13, wherein the fourth metal oxide layer comprises
one selected from the group consisting of: a single element or two more elements of Zr, Hf, Ta, Y, La and Al; a silicated compound material of the element; and a nitriding silicated compound material of the element.

16. A method for fabricating a complementary semiconductor device comprising:
forming a gate insulating film on a semiconductor substrate;
forming a dummy gate on the gate insulating film;
forming source/drain regions for n-MISFETs, and source/drain regions for p-MISFETs;
removing the dummy gate;
forming a first metal oxide layer having a composition ratio shown with M1xM2yO (where M1=Y, La, Ce, Pr, Nd, Sm, Gd, Tb, Dy, Ho, Er, Tm, Yb or Lu, M2=Hf, Zr or Ta, and x/(x+y)>0.12) on the gate insulating film by ALD or CVD;

forming a third metal oxide layer having a composition ratio shown with M3zM4wO (where M3=Al, M4=Hf, Zr or Ta, and z/(z+w)>0.14) on the gate insulating film by ALD or CVD;

forming a second metal oxide layer on the first metal oxide layer by ALD or CVD;

forming a fourth metal oxide layer on the third metal oxide layer by ALD or CVD;

forming a first conductive layer on the second metal oxide layer;

forming a second conductive layer on the fourth metal oxide layer; and forming a gate structure by a lithography process and an etching process.

17. The method according to claim 16, wherein the second metal oxide layer comprises one selected from the group consisting of a single element or two more elements of Zr, Hf, Ta, Y, La and Al; a silicated compound material of the element; and a nitriding silicated compound material of the element.

18. The method according to claim 16, wherein the fourth metal oxide layer comprises one selected from the group consisting of: a single element or two more elements of Zr, Hf, Ta, Y, La and Al; a silicated compound material of the element; and a nitriding silicated compound material of the element.

19. The method according to claim 17, wherein the fourth metal oxide layer comprises one selected from the group consisting of: a single element or two more elements of Zr, Hf, Ta, Y, La and Al; a silicated compound material of the element; and a nitriding silicated compound material of the element.

* * * * *